United States Patent
Iwano

(10) Patent No.: US 9,881,802 B2
(45) Date of Patent: Jan. 30, 2018

(54) SLURRY, POLISHING LIQUID SET, POLISHING LIQUID, METHOD FOR POLISHING SUBSTRATE, AND SUBSTRATE

(71) Applicant: Tomohiro Iwano, Hitachi (JP)

(72) Inventor: Tomohiro Iwano, Hitachi (JP)

(73) Assignee: HITACHI CHEMICAL COMPANY, LTD, Tokyo (JP)

( * ) Notice: Subject to any disclaimer, the term of this patent is extended or adjusted under 35 U.S.C. 154(b) by 0 days.

(21) Appl. No.: 13/755,024

(22) Filed: Jan. 31, 2013

(65) Prior Publication Data

US 2013/0137265 A1    May 30, 2013

Related U.S. Application Data

(63) Continuation of application No. 13/582,972, filed as application No. PCT/JP2011/076827 on Nov. 21, 2011.

(30) Foreign Application Priority Data

Nov. 22, 2010   (JP) .................. 2010-260039

(51) Int. Cl.
| | |
|---|---|
| B24D 3/02 | (2006.01) |
| C09C 1/68 | (2006.01) |
| C09K 3/14 | (2006.01) |
| H01L 21/306 | (2006.01) |
| C09G 1/02 | (2006.01) |

(Continued)

(52) U.S. Cl.
CPC ...... *H01L 21/30625* (2013.01); *B24B 37/044* (2013.01); *C09G 1/02* (2013.01); *C09K 3/1463* (2013.01); *C09K 13/12* (2013.01); *H01L 21/31053* (2013.01)

(58) Field of Classification Search
None
See application file for complete search history.

(56) References Cited

U.S. PATENT DOCUMENTS

| | | |
|---|---|---|
| 3,097,083 A | 7/1963 | Silvernail |
| 3,123,452 A | 3/1964 | Harris et al. |

(Continued)

FOREIGN PATENT DOCUMENTS

| | | |
|---|---|---|
| CN | 1384170 A | 12/2002 |
| CN | 1457506 | 11/2003 |

(Continued)

OTHER PUBLICATIONS

U.S. Office Action dated Mar. 27, 2013 in connection with U.S. Appl. No. 13/582,961; 11 pages; U.S. Patent and Trademark Office; Alexandria, Virginia; USA.

(Continued)

*Primary Examiner* — Kaj K Olsen
*Assistant Examiner* — Ross J Christie
(74) *Attorney, Agent, or Firm* — Fitch, Even, Tabin & Flannery LLP

(57) ABSTRACT

A polishing liquid includes abrasive grains, an additive and water, wherein the abrasive grains include a tetravalent metal element hydroxide, and produce a liquid phase with a nonvolatile content of 500 ppm or greater when an aqueous dispersion with a content of the abrasive grains adjusted to 1.0 mass % has been centrifuged for 50 minutes at a centrifugal acceleration of $1.59 \times 10^5$ G.

25 Claims, 7 Drawing Sheets

(51) Int. Cl.
  *H01L 21/3105* (2006.01)
  *C09K 13/12* (2006.01)
  *B24B 37/04* (2012.01)

(56) References Cited

U.S. PATENT DOCUMENTS

| | | | |
|---|---|---|---|
| 5,529,969 | A | 6/1996 | Bonneau et al. |
| 5,908,800 | A | 6/1999 | Bonneau et al. |
| 6,420,269 | B2 | 7/2002 | Matsuzawa et al. |
| 6,440,856 | B1 | 8/2002 | Bessho et al. |
| 6,589,496 | B1 | 7/2003 | Yabe et al. |
| 6,786,945 | B2 | 9/2004 | Machii et al. |
| 2002/0016060 | A1 | 2/2002 | Matsuzawa et al. |
| 2004/0065022 | A1* | 4/2004 | Machii et al. ............ 51/309 |
| 2005/0028450 | A1 | 2/2005 | Xu et al. |
| 2005/0074384 | A1 | 4/2005 | Yabe et al. |
| 2005/0255693 | A1 | 11/2005 | Liu et al. |
| 2006/0278614 | A1 | 12/2006 | Wang et al. |
| 2006/0289826 | A1 | 12/2006 | Koyama et al. |
| 2007/0166216 | A1 | 7/2007 | Chinone et al. |
| 2007/0181535 | A1 | 8/2007 | De Rege Thesauro et al. |
| 2007/0251270 | A1 | 11/2007 | Miyatani et al. |
| 2009/0318063 | A1 | 12/2009 | Misra |
| 2010/0107509 | A1 | 5/2010 | Guiselin |
| 2011/0006251 | A1 | 1/2011 | Chinone et al. |
| 2011/0275217 | A1 | 11/2011 | Satou et al. |
| 2012/0299158 | A1* | 11/2012 | Shinoda et al. ............ 257/618 |

FOREIGN PATENT DOCUMENTS

| | | | |
|---|---|---|---|
| CN | 1524917 | A | 9/2004 |
| CN | 1610963 | A | 4/2005 |
| CN | 1746255 | A | 3/2006 |
| CN | 1290162 | C | 12/2006 |
| CN | 1935927 | A | 3/2007 |
| CN | 1948418 | A | 4/2007 |
| CN | 101395097 | A | 3/2009 |
| CN | 101611476 | A | 12/2009 |
| CN | 101649182 | A | 2/2010 |
| CN | 102408836 | A | 4/2012 |
| EP | 0541158 | | 5/1993 |
| EP | 0541158 | A1 | 5/1993 |
| EP | 0992456 | A1 | 4/2000 |
| EP | 1 369 906 | A1 | 12/2003 |
| JP | 8-22970 | | 1/1996 |
| JP | 09-270402 | | 10/1997 |
| JP | 10-106994 | | 4/1998 |
| JP | 2002-241739 | | 8/2002 |
| JP | 2004-155913 | A | 6/2004 |
| JP | 2006-182604 | | 7/2006 |
| JP | 2006-249129 | | 9/2006 |
| JP | 2008-199043 | | 8/2008 |
| JP | 2008-290183 | | 12/2008 |
| JP | 2009-010402 | A | 1/2009 |
| JP | 2009-067627 | | 4/2009 |
| JP | 2009-212378 | | 9/2009 |
| JP | 2009-290188 | | 12/2009 |
| JP | 2009290188 | A * | 12/2009 |
| JP | 2010-16064 | | 1/2010 |
| JP | 2010-505735 | | 2/2010 |
| JP | 2010-141288 | | 6/2010 |
| JP | 2010-153781 | | 7/2010 |
| JP | 2010-153782 | | 7/2010 |
| JP | 2010-158747 | | 7/2010 |
| JP | 2011-151405 | A | 8/2011 |
| JP | 2012-084906 | | 4/2012 |
| TW | 201132749 | A1 | 10/2011 |
| WO | WO 02/067309 | A1 | 8/2002 |
| WO | WO 2009/131133 | A1 | 10/2009 |
| WO | WO 2010/067844 | A1 | 6/2010 |
| WO | 2011071168 | | 6/2011 |
| WO | WO 2011/071168 | A1 | 6/2011 |
| WO | WO 2011/111421 | A1 | 9/2011 |
| WO | 2012070541 | A1 | 5/2012 |
| WO | 2012070542 | A1 | 5/2012 |

OTHER PUBLICATIONS

English translation of PCT/ISA/237 in connection with No. PCT/JP2011/076827, 6 pages.
Japanese claims from PCT/JP2011/076827 (published in WO 2012/070542), 4 pages.
Certified English translation of claims from PCT/JP2011/076827, 5 pages.
U.S. Office Action dated Apr. 16, 2013, for U.S. Appl. No. 13/582,969.
Communication dated Jun. 20, 2013, in connection with International Application No. PCT/JP2011/076827; 8 pages; the International Bureau of WIPO; Geneva, Switzerland.
Communication dated Jun. 20, 2013, in connection with International Application No. PCT/JP2011/076822; 8 pages; the International Bureau of WIPO; Geneva, Switzerland.
Communication dated Jun. 20, 2013, in connection with International Application No. PCT/JP2011/076830; 7 pages; the International Bureau of WIPO; Geneva, Switzerland.
U.S. Office Action dated Sep. 17, 2013, in connection with U.S. Appl. No. 13/582,969; 36 pages; U.S. Patent and Trademark Office; Alexandria, Virginia; USA.
Office Action dated Oct. 9, 2014, in connection with U.S. Appl. No. 13/582,969; 39 pages; U.S. Patent and Trademark Office.
Communication in connection with corresponding counterpart application No. TW 102110935, dated Dec. 2, 2014.
U.S. Office Action dated Dec. 11, 2013, in connection with U.S. Appl. No. 13/582,972; 83 pages; U.S. Patent and Trademark Office; Alexandria, Virginia; USA.
Skoog, Douglas A., et al., "Fundamentals of Analytical Chemistry", Seventh Edition, Saunders College Publishing, 1996, pp. 502-519.
Communication dated May 13, 2014, in connection with Chinese Patent Application No. 201180055799.9, 7 pages; Chinese Patent Office, People's Republic of China.
Communication dated May 28, 2014, in connection with Chinese Patent Application No. 201310317864.1, 5 pages; Chinese Patent Office, People's Republic of China.
Communication dated Jul. 10, 2014, in connection with Chinese Patent Application No. 201310335723.2, 15 pages; Chinese Patent Office, China.
Office Action dated Jul. 28, 2015, for Japanese Application No. 2013-098585; 2 pages.
Office Action dated Jul. 28, 2015, for Japanese Application No. 2013-098705; 4 pages.
Office Action dated Sep. 16, 2015, for U.S. Appl. No. 13/582,969.
Ansari et al., "Synthesis and optical properties of nanostructured Ce(OH)4", Journal of Semiconductors, vol. 31, No. 3, Mar. 2010.
Office Action dated Oct. 19, 2015, for Chinese Application No. 201310335599.X.
Communication dated May 19, 2015, for Chinese Patent Application No. 201180055798.4.
U.S. Office Action dated May 6, 2014, in connection with U.S. Appl. No. 13/582,961; 34 pages; U.S. Patent and Trademark Office; Alexandria, Virginia; USA.
U.S. Office Action dated May 20, 2014, in connection with U.S. Appl. No. 13/756,456; 29 pages; U.S. Patent and Trademark Office; Alexandria, Virginia; USA.
Certified English translation of claims from PCT/JP2011/076822.
Communication issued in connection with PCT/JP2013/058782, dated Dec. 4, 2014.
Communication issued in connection with PCT Application No. PCT/JP2013/058770, dated Dec. 4, 2014.
Communication issued in connection with PCT Application No. PCT/JP2013/058831, dated Dec. 4, 2014.
International Search Report dated Jul. 2, 2013, in connection with International Application No. PCT/JP2013/058782.
English translation of PCT/ISA/237 in connection with PCT/JP2011/076822.
U.S. Office Action dated Dec. 13, 2016, for U.S. Appl. No. 13/575,078.
U.S. Office Action dated Dec. 16, 2015, for U.S. Appl. No. 13/575,078.

(56) References Cited

OTHER PUBLICATIONS

U.S. Office Action dated May 31, 2013, for U.S. Appl. No. 13/575,078.
U.S. Office Action dated Jun. 17, 2015, for U.S. Appl. No. 13/575,078.
U.S. Office Action dated Dec. 31, 2013, for U.S. Appl. No. 13/575,078.
U.S. Office Action dated May 6, 2014, for U.S. Appl. No. 13/582,961.
U.S. Office Action dated Apr. 27, 2015, for U.S. Appl. No. 13/582,969.
U.S. Office Action dated Apr. 8, 2014, for U.S. Appl. No. 13/582,969.
U.S. Office Action dated Feb. 11, 2016, for U.S. Appl. No. 13/582,969.
U.S. Office Action dated Nov. 27, 2015, for U.S. Appl. No. 13/582,969.
U.S. Office Action dated Dec. 6, 2016, for U.S. Appl. No. 13/582,972.
U.S. Office Action dated May 19, 2015, for U.S. Appl. No. 13/582,972.
U.S. Office Action dated May 30, 2013, for U.S. Appl. No. 13/582,972.
U.S. Office Action dated Nov. 2, 2015, for U.S. Appl. No. 13/582,972.
U.S. Office Action dated May 20, 2014, for U.S. Appl. No. 13/756,456.
U.S. Office Action dated Jul. 18, 2016, for U.S. Appl. No. 14/401,233.
U.S. Office Action dated Mar. 23, 2016, for U.S. Appl. No. 14/401,233.
U.S. Office Action dated Aug. 12, 2015, for U.S. Appl. No. 14/401,246.
U.S. Office Action dated Feb. 10, 2016, for U.S. Appl. No. 14/401,246.
U.S. Office Action dated May 17, 2016, for U.S. Appl. No. 14/401,246.
U.S. Office Action dated Nov. 2, 2016, for U.S. Appl. No. 14/401,283.
English language mechanical translation of JP 2010153782 A.
Ansari et al., "Synthesis and optical properties of nanostructured Ce(HO)4", Journal of Semiconductors, vol. 31, No. 3, Mar. 2010 (4 pages).

* cited by examiner

SLURRY, POLISHING LIQUID SET, POLISHING LIQUID, METHOD FOR POLISHING SUBSTRATE, AND SUBSTRATE

TECHNICAL FIELD

The present invention relates to a slurry, a polishing liquid set, a polishing liquid, a substrate polishing method, and a substrate. In particular, the invention relates to a slurry, a polishing liquid set, a polishing liquid, a substrate polishing method and a substrate, to be used in manufacturing steps for semiconductor elements.

BACKGROUND ART

In recent years, machining techniques for increasing density and micronization are becoming ever more important in manufacturing steps for semiconductor elements. One such machining technique, chemical mechanical polishing (CMP), has become an essential technique in manufacturing steps for semiconductor elements, for formation of Shallow Trench Isolation (hereunder also referred to as "STI"), flattening of premetal dielectric layers and interlayer dielectric films, and formation of plugs and embedded metal wirings.

Fumed silica-based polishing liquids are commonly used in CMP during conventional manufacturing steps for semiconductor elements, in order to flatten the insulating films such as silicon oxide films that are formed by methods such as CVD (Chemical Vapor Deposition) or spin coating methods. Fumed silica-based polishing liquids are produced by conducting grain growth of abrasive grains by methods such as thermal decomposition with silicon tetrachloride, and adjusting the pH. However, such silica-based polishing liquids have the technical problem of low polishing rate.

Incidentally, STI is used for device isolation on integrated circuits in generation devices starting from design rules of 0.25 μm. In STI formation, CMP is used to remove excess silicon oxide films after formation on substrates. In order to halt polishing in CMP, a stopper film with a slow polishing rate is formed under the silicon oxide film. A silicon nitride film or polysilicon film is used for the stopper film, preferably with a high polishing selective ratio of the silicon oxide film with respect to the stopper film (polishing rate ratio: polishing rate on silicon oxide film/polishing rate on stopper film). A silica-based polishing liquid such as a conventional colloidal silica-based polishing liquid has a low polishing selective ratio of about 3 for the silicon oxide film with respect to the stopper film, and it tends not to have properties that can withstand practical use for STI.

On the other hand, cerium oxide-based polishing liquids comprising cerium oxide particles as abrasive grains are used as polishing liquids for glass surfaces such as photomasks or lenses. Cerium oxide-based polishing liquids have the advantage of faster polishing rate compared to silica-based polishing liquids comprising silica particles as the abrasive grains, or alumina-based polishing liquids comprising alumina particles as the abrasive grains. In recent years, polishing liquids for semiconductors, employing high-purity cerium oxide particles, have come to be used as cerium oxide-based polishing liquids (see Patent document 1, for example).

A variety of properties are required for polishing liquids such as cerium oxide-based polishing liquids. For example, it is required to increase the dispersibility of the abrasive grains such as cerium oxide particles, and to accomplish flat polishing of substrates with irregularities. Using STI as an example, there is a demand for improving polishing selective ratios for inorganic insulating films (such as silicon oxide films) as films to be polished, with respect to the polishing rates for stopper films (such as silicon nitride films or polysilicon films). Additives are often added to polishing liquids to meet this demand. For example, there is known addition of additives to polishing liquids containing cerium oxide-based particles, to control the polishing rates of the polishing liquids and improve the global flatness (see Patent document 2, for example).

Incidentally, as demand increases for achieving greater micronization of wirings in recent manufacturing steps for semiconductor elements, scratches formed during polishing are becoming problematic. Specifically, when polishing using conventional cerium oxide-based polishing liquids, fine scratches have not posed problems so long as the sizes of the scratches are smaller than conventional wiring widths, but they can be problematic when it is attempted to achieve greater micronization of wirings.

A solution to this problem is being sought through studying polishing liquids that employ particles of tetravalent metal element hydroxides (see Patent document 3, for example). Methods for producing particles of tetravalent metal element hydroxides are also being studied (see Patent document 4, for example). Such techniques are aimed at reducing particle-induced scratches, by maintaining the chemical action of the tetravalent metal element hydroxide particles while minimizing their mechanical action.

CITATION LIST

Patent Literature

[Patent document 1] Japanese Unexamined Patent Application Publication HEI No. 10-106994
[Patent document 2] Japanese Unexamined Patent Application Publication HEI No. 08-022970
[Patent Document 3] International Patent Publication No. WO02/067309
[Patent document 4] Japanese Unexamined Patent Application Publication No. 2006-249129

SUMMARY OF INVENTION

Technical Problem

The techniques described in Patent documents 3 and 4, however, cannot be said to provide sufficiently high polishing rate, despite reduction in scratches. Since polishing rate directly affects the efficiency of the production process, polishing liquids with higher polishing rates are desired.

When the polishing liquid contains an additive, the effect obtained by adding the additive is often offset by reduced polishing rate, and it has been difficult to achieve polishing rate together with additional polishing properties.

The present invention is directed toward solving the problems described above, and it is an object thereof to provide a slurry that allows polishing of films at a superior polishing rate compared to conventional polishing liquids. It is another object of the invention to provide a slurry that can yield a polishing liquid that allows polishing of films at a superior polishing rate compared to conventional polishing liquids while allowing the addition effects of additives to be maintained.

It is yet another object of the invention to provide a polishing liquid set and polishing liquid that allow polishing of films at a superior polishing rate compared to conventional polishing liquids while allowing the addition effects of additives to be maintained.

It is yet another object of the invention to provide a polishing method using the slurry, polishing liquid set or polishing liquid, and a substrate obtained by the method.

Solution to Problem

The present inventors have conducted diligent research on slurries using abrasive grains comprising tetravalent metal element hydroxides, and as a result, they have found that films can be polished at superior polishing rates compared to conventional polishing liquids, irrespective of the presence or absence of additives, by using abrasive grains that produce a liquid phase with a high nonvolatile content when an aqueous dispersion comprising the abrasive grains dispersed in water has been centrifuged under specific conditions.

Specifically, the slurry of the invention comprises abrasive grains and water, the abrasive grains including a tetravalent metal element hydroxide, and producing a liquid phase with a nonvolatile content of 500 ppm or greater when an aqueous dispersion with a content of the abrasive grains adjusted to 1.0 mass % has been centrifuged for 50 minutes at a centrifugal acceleration of $1.59 \times 10^5$ G. An aqueous dispersion with a content of the abrasive grains adjusted to a prescribed value is a liquid comprising the prescribed amount of abrasive grains and water. Here, "ppm" represents ppm by mass, namely "parts per million mass".

With a slurry according to the invention, when a polishing liquid obtained by adding an additive to the slurry is used, it is possible to accomplish polishing of films at superior polishing rate compared to conventional polishing liquids, while maintaining the effects of adding the additives. In addition, it is also possible to accomplish polishing of films with superior polishing rate compared to conventional polishing liquids, when a slurry according to the invention is used for polishing without addition of additives. Furthermore, with a slurry according to the invention, it is possible to inhibit formation of scratches on polished surfaces since the abrasive grains include a tetravalent metal element hydroxide.

The present inventors have conducted further research on slurries using abrasive grains comprising tetravalent metal element hydroxides, and as a result, they have found that films can be polished at even more superior polishing rates compared to conventional polishing liquids, by using abrasive grains that have photoabsorption (absorbance) in a specified range for light of a specific wavelength, in an aqueous dispersion comprising a specific amount of the abrasive grains.

In a slurry according to the invention, the abrasive grains preferably produce absorbance of 1.50 or greater for light with a wavelength of 400 nm in an aqueous dispersion with a content of the abrasive grains adjusted to 1.0 mass %. This allows polishing of films with even more superior polishing rate compared to conventional polishing liquids.

In a slurry according to the invention, the abrasive grains preferably produce absorbance of 1.000 or greater for light with a wavelength of 290 nm in an aqueous dispersion with a content of the abrasive grains adjusted to 0.0065 mass % (65 ppm). This allows polishing of films with even more superior polishing rate compared to conventional polishing liquids.

In a slurry according to the invention, the abrasive grains preferably produce absorbance of not greater than 0.010 for light with a wavelength of 450-600 nm in an aqueous dispersion with a content of the abrasive grains adjusted to 0.0065 mass %. This allows polishing of films with even more superior polishing rate compared to conventional polishing liquids.

The present inventors have conducted yet further research on slurries using abrasive grains comprising tetravalent metal element hydroxides, and as a result, they have found that films can be polished at even more superior polishing rates compared to conventional polishing liquids, by using abrasive grains that can increase the light transmittance for light with a specific wavelength, in an aqueous dispersion comprising a specific amount of the abrasive grains. That is, in a slurry according to the invention, the abrasive grains preferably produce light transmittance of 50%/cm or greater for light with a wavelength of 500 nm in an aqueous dispersion with a content of the abrasive grains adjusted to 1.0 mass %.

The tetravalent metal element hydroxide is preferably obtained by mixing a tetravalent metal element salt and an alkali solution. This will allow particles with extremely fine particle sizes to be obtained as abrasive grains, thus further improving the effect of reducing scratches.

The tetravalent metal element is preferably tetravalent cerium. This will yield fine particles with high chemical activity as abrasive grains, and will therefore allow polishing of films with even more superior polishing rate compared to conventional polishing liquids.

The present inventors have found that, for a polishing liquid comprising additives in addition to the constituent components of the slurry, the reduction in polishing rate for films that occurs with addition of the additives can be avoided by using abrasive grains that produce a liquid phase with a high nonvolatile content when an aqueous dispersion comprising the abrasive grains dispersed in water has been centrifuged under specific conditions.

Specifically, a polishing liquid set according to the invention comprises the constituent components of a polishing liquid separately stored as a first liquid and second liquid, so that the first liquid and second liquid are mixed to form the polishing liquid, the first liquid being the aforementioned slurry, and the second liquid comprising an additive and water. With the polishing liquid set of the invention, it is possible to accomplish polishing of films at a superior polishing rate compared to conventional polishing liquids, while maintaining the effects of adding additives. The polishing liquid set of the invention can inhibit formation of scratches.

The additive is preferably at least one selected from the group consisting of vinyl alcohol polymers and derivatives of the vinyl alcohol polymers. In this case, the additive will cover the abrasive grain surfaces to inhibit adhesion of the abrasive grains onto the surface to be polished, thereby improving the dispersibility of the abrasive grains and improving the stability of the polishing liquid. It can also improve the cleanability of the polished surface.

The content of the additive is preferably 0.01 mass % or greater based on the total mass of the polishing liquid. This will allow polishing of films with even more superior polishing rate compared to conventional polishing liquids, while allowing the effect of the additives to be obtained.

Also, the polishing liquid of the invention comprises abrasive grains, an additive and water, the abrasive grains including a tetravalent metal element hydroxide, and producing a liquid phase with a nonvolatile content of 500 ppm or greater when an aqueous dispersion with a content of the abrasive grains adjusted to 1.0 mass % has been centrifuged for 50 minutes at a centrifugal acceleration of $1.59 \times 10^5$ G.

With the polishing liquid of the invention, it is possible to accomplish polishing of films at a superior polishing rate compared to conventional polishing liquids, while maintaining the effects of adding additives. Furthermore, with a polishing liquid of the invention, it is possible to inhibit formation of scratches on polished surfaces since the abrasive grains include a tetravalent metal element hydroxide.

In a polishing liquid of the invention, the abrasive grains preferably produce absorbance of 1.50 or greater for light with a wavelength of 400 nm in an aqueous dispersion with a content of the abrasive grains adjusted to 1.0 mass %. This allows polishing of films with even more superior polishing rate compared to conventional polishing liquids.

In a polishing liquid of the invention, the abrasive grains preferably produce absorbance of 1.000 or greater for light with a wavelength of 290 nm in an aqueous dispersion with a content of the abrasive grains adjusted to 0.0065 mass %. This allows polishing of films with even more superior polishing rate compared to conventional polishing liquids.

In a polishing liquid of the invention, the abrasive grains preferably produce absorbance of not greater than 0.010 for light with a wavelength of 450-600 nm in an aqueous dispersion with a content of the abrasive grains adjusted to 0.0065 mass %. This allows polishing of films with even more superior polishing rate compared to conventional polishing liquids.

In a polishing liquid of the invention, the abrasive grains preferably produce light transmittance of 50%/cm or greater for light with a wavelength of 500 nm in an aqueous dispersion with a content of the abrasive grains adjusted to 1.0 mass %. This will make it possible to easily obtain both a superior polishing rate and the effects of adding additives compared to conventional polishing liquids.

The tetravalent metal element hydroxide in the polishing liquid of the invention is preferably obtained by mixing a tetravalent metal element salt and an alkali solution. This will allow particles with extremely fine particle sizes to be obtained as abrasive grains, thus a polishing liquid with an even more excellent effect of reducing scratches can be obtained.

The tetravalent metal element in the polishing liquid of the invention is preferably tetravalent cerium. This yields fine particles with high chemical activity as abrasive grains, and therefore allows polishing of films with even more superior polishing rate compared to conventional polishing liquids.

The additive in the polishing liquid of the invention is preferably at least one selected from the group consisting of vinyl alcohol polymers and derivatives of the vinyl alcohol polymers. In this case, the additive will cover the abrasive grain surfaces to inhibit adhesion of the abrasive grains onto the surface to be polished, thereby improving the dispersibility of the abrasive grains and improving the stability of the polishing liquid. It can also improve the cleanability of the polished surface.

The content of the additive in the polishing liquid of the invention is preferably 0.01 mass % or greater based on the total mass of the polishing liquid. This will allow polishing of films with even more superior polishing rate compared to conventional polishing liquids, while allowing the effects of the additives to be obtained.

The invention further provides a substrate polishing method using the aforementioned slurry, polishing liquid set or polishing liquid. The polishing method allows polishing of films at a superior polishing rate compared to conventional polishing methods. In addition, the polishing method can inhibit formation of scratches and yield a substrate with excellent flatness.

A first embodiment of the polishing method of the invention is a polishing method employing the aforementioned slurry. Specifically, the polishing method of the first embodiment comprises a step of placing a film to be polished, of a substrate which has the film to be polished on its surface, so as to face an abrasive pad, and a step of polishing at least a portion of the film to be polished while supplying the aforementioned slurry between the abrasive pad and the film to be polished.

Second and third embodiments of the polishing method of the invention are polishing methods using the aforementioned polishing liquid set. These polishing methods can avoid the problems of abrasive grain aggregation and changes in polishing properties, which are concerns with prolonged storage after mixture of additives.

Specifically, the polishing method of the second embodiment comprises a step of placing a film to be polished, of a substrate which has the film to be polished on its surface, so as to face an abrasive pad, a step of mixing the first liquid and second liquid of the aforementioned polishing liquid set to obtain a polishing liquid, and a step of polishing at least a portion of the film to be polished while supplying the polishing liquid between the abrasive pad and the film to be polished. The substrate polishing method of the third embodiment comprises a step of placing a film to be polished, of a substrate which has the film to be polished on its surface, so as to face an abrasive pad, and a step of polishing at least a portion of the film to be polished while respectively supplying both the first liquid and second liquid of the polishing liquid set between the abrasive pad and the film to be polished.

A fourth embodiment of the polishing method of the invention is a polishing method employing the aforementioned polishing liquid. Specifically, the polishing method of the fourth embodiment comprises a step of placing a film to be polished, of a substrate which has the film to be polished on its surface, so as to face an abrasive pad, and a step of polishing at least a portion of the film to be polished while supplying the aforementioned polishing liquid between the abrasive pad and the film to be polished.

The film to be polished preferably includes silicon oxide. The surface of the film to be polished preferably has irregularities. These polishing methods allow the characteristics of the polishing liquid to be adequately exhibited.

The substrate of the invention is one that has been polished by the aforementioned polishing method.

Advantageous Effects of Invention

With the slurry of the invention, it is possible to accomplish polishing of a film to be polished at a superior polishing rate compared to a conventional polishing liquid. With the slurry of the invention, it is also possible to obtain a polishing liquid that allows polishing of films at a superior polishing rate compared to conventional polishing liquids, while maintaining the effects of adding additives. Also, with the polishing liquid set and polishing liquid of the invention, it is possible to accomplish polishing of films at a superior polishing rate compared to conventional polishing liquids, while maintaining the effects of adding additives. The polishing method of the invention has excellent throughput since it allows polishing of films at superior polishing rate, while permitting desired properties (such as flatness and selectivity) to be obtained when using additives.

DESCRIPTION OF EMBODIMENTS

Figure 1:
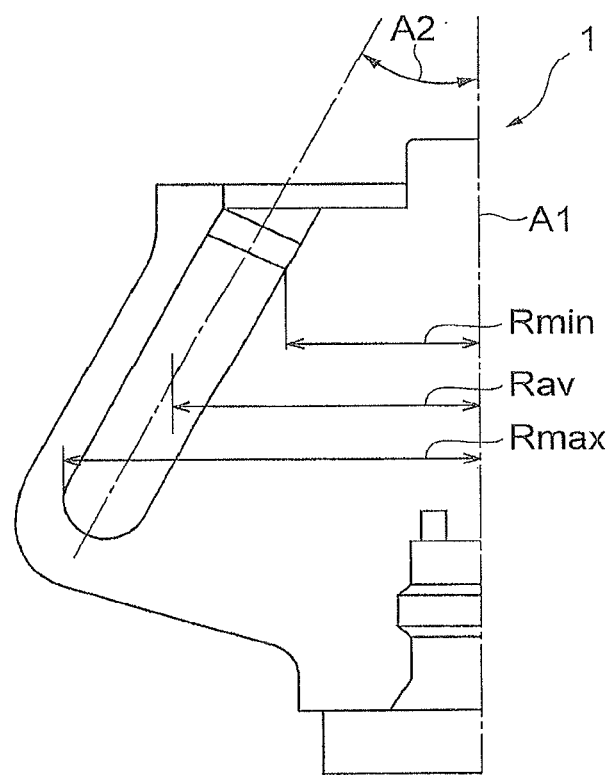
FIG. 1 is a schematic cross-sectional view of an example of an angle rotor.

Embodiments of the invention will now be explained in detail.

<Polishing Liquid>

The polishing liquid of this embodiment comprises at least abrasive grains, an additive and water. Each of these constituent components will now be explained.

(Abrasive Grains)

The abrasive grains include a tetravalent metal element hydroxide. The tetravalent metal element is preferably a rare earth element, and from the viewpoint of facilitating formation of a hydroxide suitable for polishing, it is more preferably at least one kind selected from the group consisting of scandium, yttrium, lanthanum, cerium, praseodymium, neodymium, promethium, gadolinium, terbium, dysprosium, holmium, erbium, thulium, ytterbium and lutetium. The tetravalent metal element is even more preferably cerium, from the viewpoint of ready availability and a more superior polishing rate.

The abrasive grains are preferably composed of a tetravalent metal element hydroxide, and from the viewpoint of high chemical activity and a more superior polishing rate, they are more preferably composed of a hydroxide of tetravalent cerium. The polishing liquid of this embodiment may also combine other types of abrasive grains, within ranges that do not impair the properties of the abrasive grains including the tetravalent metal element hydroxide. Specifically, abrasive grains of silica, alumina or zirconia, for example, may be used.

The content of the tetravalent metal element hydroxide in the abrasive grains is preferably 50 mass % or greater, more preferably 60 mass % or greater, even more preferably 70 mass % or greater, especially more preferably 80 mass % or greater and extremely preferably 90 mass % or greater, based on the total mass of the abrasive grains.

Of the constituent components of the polishing liquid of this embodiment, the tetravalent metal element hydroxide is believed to have a major effect on the polishing properties. Thus, adjusting the content of the tetravalent metal element hydroxide can improve chemical interaction between the abrasive grains and surface to be polished, and further improve the polishing rate. Specifically, the content of the tetravalent metal element hydroxide is preferably 0.01 mass % or greater, more preferably 0.05 mass % or greater and even more preferably 0.1 mass % or greater based on the total mass of the polishing liquid, from the viewpoint of helping to sufficiently exhibit the function of the tetravalent metal element hydroxide. In addition, the content of the tetravalent metal element hydroxide is preferably not greater than 8 mass % and more preferably not greater than 5 mass % based on the total mass of the polishing liquid, from the viewpoint of helping to avoid aggregation of the abrasive grains.

The abrasive grain content is not particularly restricted, but from the viewpoint of helping to avoid aggregation of the abrasive grains and allowing the abrasive grains to effectively act on the surface to be polished to smoothly promote polishing, it is preferably 0.01-10 mass % and more preferably 0.1-5 mass % based on the total mass of the polishing liquid.

The mean secondary particle size of the abrasive grains (hereunder referred to as "mean particle size", unless otherwise specified) is preferably 1-200 nm from the viewpoint of obtaining a more superior polishing rate. Since a smaller mean particle size to some extent increases the specific surface area of the abrasive grains that contact with the surface to be polished, and thus allowing the polishing rate to further improved, the mean particle size is more preferably not greater than 150 nm, even more preferably not greater than 100 nm, especially more preferably not greater than 80 nm and extremely preferably not greater than 50 nm. Since a larger mean particle size to some extent tends to facilitate increase in the polishing rate, the mean particle size is more preferably at least 2 nm and even more preferably at least 5 nm.

The mean particle size of the abrasive grains can be measured with a particle size distribution meter based on the photon correlation method, and specifically, it may be measured using a Zetasizer 3000HS by Malvern Instruments Ltd. or an N5 by Beckman Coulter, Inc., for example. Specifically, in a measuring method using a Zetasizer 3000HS, for example, an aqueous dispersion with the content of the abrasive grains adjusted to 0.2 mass % is prepared, and approximately 4 mL (where L represents "liters", same hereunder) of the aqueous dispersion is poured into a 1 cm-square cell, and the cell is placed in the apparatus. Measurement is conducted at 25° C. with a dispersing medium refractive index of 1.33 and a viscosity of 0.887 mPa·s, and the value represented as Z-average Size is read as the mean particle size of the abrasive grains.

[Nonvolatile Content]

The abrasive grains are believed to comprise large particles with particle sizes that can be measured with a particle size distribution meter, and fine particles with particle sizes that cannot be measured with a particle size distribution meter. When an aqueous dispersion comprising such abrasive grains dispersed in water has been centrifuged by the action of sufficient centrifugal force, the aqueous dispersion undergoes mainly solid-liquid separation into the precipitate and the supernatant liquid (liquid phase), with the large particles settling as the precipitate and the fine particles floating up into the supernatant liquid.

The present inventors have found that films can be polished at superior polishing rates compared to conventional polishing liquids, by using abrasive grains that can produce a supernatant liquid with a high nonvolatile content when an aqueous dispersion comprising a sufficient amount of the abrasive grains has been centrifuged under conditions that allow action of centrifugal force that can adequately separate the large particles and fine particles. Specifically, the abrasive grains of this embodiment produce a supernatant liquid with a nonvolatile content of 500 ppm or greater when an aqueous dispersion with a content of the abrasive grains adjusted to 1.0 mass % has been centrifuged for 50 minutes at a centrifugal acceleration of $1.59 \times 10^5$ G.

The present inventors conjecture the following as the reason for which an effect of improving polishing rate is obtained when the nonvolatile content of the centrifuged supernatant liquid is high. A high nonvolatile content means that the proportion of fine particles is high, and presumably an increased nonvolatile content enlarges the surface area of the abrasive grains contacting with the surface to be polished. It is thought that this promotes polishing by chemical action, and improves the polishing rate compared to the prior art.

The nonvolatile content of the supernatant liquid is preferably 1000 ppm or greater, more preferably 1500 ppm or greater, even more preferably 2000 ppm or greater and especially preferably 3000 ppm or greater, from the viewpoint of obtaining an even more superior polishing rate. The upper limit for the nonvolatile content of the supernatant liquid is not particularly restricted, for the reasons explained above, and it may be 100000 ppm, for example.

The apparatus used for the centrifugal separation may be an angle rotor having a tube positioned at a prescribed angle, or a swing rotor having a variable tube angle, with the tube positioned horizontally or nearly horizontally during the centrifugal separation.

FIG. 1 is a schematic cross-sectional view of an example of an angle rotor. The angle rotor 1 has bilateral symmetry around rotation axis A1 as the center, and only one side (the left side) is shown in FIG. 1 while the other side (the right side) is omitted. In FIG. 1, A2 is the tube angle, $R_{min}$ is the minimum radius from the rotation axis A1 to the tube, and $R_{max}$ is the maximum radius from the rotation axis A1 to the tube. $R_{av}$ is the average radius from the rotation axis A1 to the tube, and is calculated as "$(R_{min}+R_{max})/2$".

For this type of centrifugal separation apparatus, the centrifugal acceleration [units: G] can be calculated by the following formula (1).

$$\text{Centrifugal acceleration}[G] = 1118 \times R \times N^2 \times 10^{-8} \quad (1)$$

(In the formula, R represents the radius of rotation (cm), and N represents the rotational speed per minute (rpm=revolutions per minute).)

For this embodiment, centrifugal separation is carried out with the rotational speed N set for a centrifugal acceleration of $1.59 \times 10^5$ G using the value of the average radius $R_{av}$ in FIG. 1 as the radius of rotation R in formula (1). When a swing rotor is to be used instead of an angle rotor as shown in FIG. 1, the minimum radius $R_{min}$, maximum radius $R_{max}$ and average radius $R_{av}$ are each calculated from the state of the tube in the centrifugal separation, to set the conditions.

The abrasive grains may be separated into large particles and fine particles using a 70P-72 ultracentrifuge by Hitachi Koki Co., Ltd., for example, as the angle rotor. Specifically, centrifugal separation of the aqueous dispersion using a 70P-72 may be carried out in the following manner, as an example. First, an aqueous dispersion with a content of the abrasive grain adjusted to 1.0 mass % is prepared, and after filling it into a centrifuge tube, the centrifuge tube is placed in a rotor. After rotating for 50 minutes at a rotational speed of 50000 rpm, the centrifuge tube is removed from the rotor and the supernatant liquid in the centrifuge tube is collected. The nonvolatile content of the supernatant liquid can be calculated by measuring the mass of the collected supernatant liquid and the mass of the residue after drying the supernatant liquid.

[Absorbance]

The abrasive grains preferably satisfy either or both of the following conditions (a) and (b).

(a) The abrasive grains produce absorbance of 1.50 or greater for light with a wavelength of 400 nm in an aqueous dispersion with a content of the abrasive grains adjusted to 1.0 mass %.

(b) The abrasive grains produce absorbance of 1.000 or greater for light with a wavelength of 290 nm in an aqueous dispersion with a content of the abrasive grains adjusted to 0.0065 mass %.

The present inventors have found that films can be polished at even more superior polishing rate compared to conventional polishing liquids, by using abrasive grains satisfying the aforementioned conditions for absorbance of light with a wavelength of 290 nm and/or with a wavelength of 400 nm. The present inventors further found that a polishing liquid and slurry satisfying these conditions have a slight yellowish tint as observed visually, and that a greater degree of yellowishness of the polishing liquid and slurry is linked to more superior polishing rate.

In regard to condition (a), it is not necessarily fully understood why an effect of improving polishing rate is obtained by using abrasive grains that produce absorbance of at least 1.50 for light with a wavelength of 400 nm in an aqueous dispersion with a content of the abrasive grains adjusted to 1.0 mass %, but the present inventors conjecture as follows. Specifically, depending on the conditions for production of the tetravalent metal element hydroxide $(M(OH)_4)$, it is believed that particles of $M(OH)_3X$, composed of a tetravalent metal $(M^{4+})$, 3 hydroxyl groups $(OH^-)$ and one anion $(X^-)$, are produced for some of the abrasive grains. In $M(OH)_3X$, the electron-withdrawing anion $(X^-)$ acts to improve the reactivity of the hydroxyl groups, and an increasing abundance of $M(OH)_3X$ is thought to lead to improved polishing rate. Also, since the $M(OH)_3X$ particles absorb light with a wavelength of 400 nm, presumably an increased abundance of $M(OH)_3X$ causes increased absorbance for light with a wavelength of 400 nm, and improves the polishing rate.

The absorption peak of $M(OH)_3X$ at a wavelength of 400 nm has been confirmed to be much lower than the absorption peak at a wavelength of 290 nm. In this regard, as a result of studying degrees of absorbance using aqueous dispersions with relatively high abrasive grain contents of 1.0 mass %, which allow absorbance to be easily detected as high absorbance, the present inventors have found that the effect of improving polishing rate is superior when using abrasive grains that produce absorbance of at least 1.50 for light with a wavelength of 400 nm in the aqueous dispersion. Incidentally, since it is thought that the absorbance for light with a wavelength of 400 nm derives from the abrasive grains, as explained above, naturally it would not be possible to polish a film at a superior polishing rate with a polishing liquid comprising a substance (such as a pigment component exhibiting a yellow color) that produces absorbance of at least 1.50 for light with a wavelength of 400 nm, instead of abrasive grains that produce absorbance of at least 1.50 for light with a wavelength of 400 nm.

The absorbance for light with a wavelength of 400 nm is more preferably 2.00 or greater, even more preferably 2.50 or greater and especially preferably 3.00 or greater, from the viewpoint of allowing polishing of films at an even more superior polishing rate. The upper limit for the absorbance for light with a wavelength of 400 nm is not particularly restricted, but is preferably 10.0, for example.

In regard to condition (b), it is not necessarily fully understood why an effect of improving polishing rate is obtained by using abrasive grains that produce absorbance of 1.000 or greater for light with a wavelength of 290 nm in an aqueous dispersion with a content of the abrasive grains adjusted to 0.0065 mass %, but the present inventors conjecture as follows. Specifically, particles of $M(OH)_3X$ that are produced depending on the production conditions for the tetravalent metal element hydroxide $M(OH)_4$ have a calculated absorption peak at a wavelength of about 290 nm, and for example, particles composed of $Ce^{4+}(OH^-)_3NO_3^-$ have an absorption peak at a wavelength of 290 nm. Consequently, it is believed that the polishing rate is improved in accordance with the increase in absorbance for light with a wavelength of 290 nm due to the increase in the abundance of $M(OH)_3X$.

Figure 6:
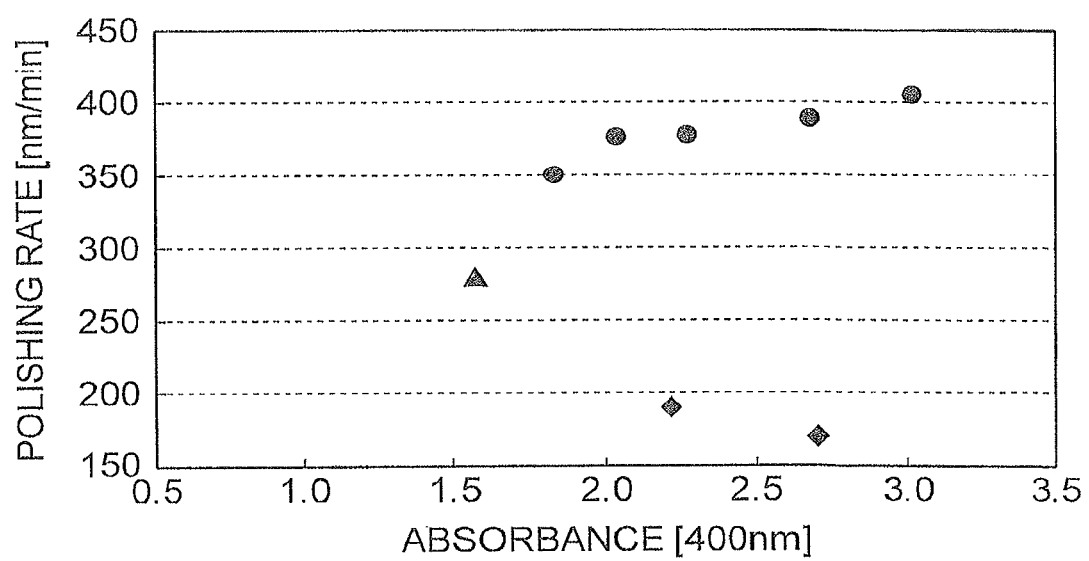
FIG. 6 is a figure showing the relationship between absorbance for light with a wavelength of 400 nm and polishing rate.

The absorbance for light with a wavelength of about 290 nm tends to be detected to a greater degree as the measuring limit is exceeded. In this regard, as a result of studying degrees of absorbance using aqueous dispersions with relatively low abrasive grain contents of 0.0065 mass %, which allow absorbance to be easily detected as low absorbance, the present inventors have found that the effect of improving polishing rate is superior when using abrasive grains that produce absorbance of at least 1.000 for light with a wavelength of 290 nm in the aqueous dispersion. The present inventors have also found that, apart from light with a wavelength of about 400 nm, which when absorbed by an absorbing substance tends to cause the absorbing substance to exhibit a yellow color, higher absorbance of abrasive grains for light with a wavelength of about 290 nm produces deeper yellowishness in a polishing liquid or slurry employing such abrasive grains. Specifically, the present inventors found that the absorbance for light with a wavelength of 290 nm in an aqueous dispersion with an abrasive grain content of 0.0065 mass % and the absorbance for light with a wavelength of 400 nm in an aqueous dispersion with an abrasive grain content of 1.0 mass % are very well correlated, as shown in FIG. 6 described below.

The absorbance for light with a wavelength of 290 nm is more preferably 1.050 or greater, even more preferably 1.100 or greater, especially more preferably 1.200 or greater and extremely preferably 1.300 or greater, from the viewpoint of allowing polishing of films at an even more superior polishing rate. The upper limit for the absorbance for light with a wavelength of 290 nm is not particularly restricted, but is preferably 10.00, for example.

From the viewpoint of polishing of films at an even more superior polishing rate with a polishing liquid of this embodiment, the abrasive grains are preferably ones that produce absorbance of at least 1.50 for light with a wavelength of 400 nm in an aqueous dispersion with a content of the abrasive grains adjusted to 1.0 mass %, while also producing absorbance of at least 1.000 for light with a wavelength of 290 nm in an aqueous dispersion with a content of the abrasive grains adjusted to 0.0065 mass %.

Also, the aforementioned metal hydroxides ($M(OH)_4$ and $M(OH)_3X$) tend not to exhibit absorption for light with wavelengths of 450 nm and greater, and especially for light with wavelengths of 450-600 nm. Therefore, from the viewpoint of minimizing adverse effects on polishing by the presence of impurities, the abrasive grains preferably produce absorbance of not greater than 0.010 for light with a wavelength of 450-600 nm in an aqueous dispersion with a content of the abrasive grains adjusted to 0.0065 mass % (65 ppm). Specifically, the absorbance preferably does not exceed 0.010 for all light within a wavelength range of 450-600 nm in an aqueous dispersion with a content of the abrasive grains adjusted to 0.0065 mass %. The absorbance for light with a wavelength of 450-600 nm is more preferably not greater than 0.005 and even more preferably not greater than 0.001. The lower limit for the absorbance for light with a wavelength of 450-600 nm is preferably 0.

The absorbance in an aqueous dispersion can be measured, for example, using a spectrophotometer (model name: U3310) by Hitachi, Ltd. Specifically, an aqueous dispersion with a content of the abrasive grains adjusted to 0.0065 mass % or 1.0 mass % is prepared as a measuring sample. Approximately 4 mL of the measuring sample is placed in a 1 cm-square cell, and the cell is set in the apparatus. Spectrophotometry is then conducted in a wavelength range of 200-600 nm, and the absorbance is judged from the obtained chart.

If absorbance of at least 1.000 is exhibited when the absorbance for light with a wavelength of 290 nm is measured with excessive dilution so that the abrasive grain content in the measuring sample is lower than 0.0065 mass %, it is clear that the absorbance will also be at least 1.000 when the abrasive grain content is 0.0065 mass %. Thus, the absorbance may be screened by measuring the absorbance using an aqueous dispersion excessively diluted so that the abrasive grain content is lower than 0.0065 mass %.

Screening of the absorbance may also be accomplished by assuming that if absorbance of at least 1.50 is exhibited when the absorbance for light with a wavelength of 400 nm is measured with excessive dilution so that the abrasive grain content is lower than 1.0 mass %, the absorbance will also be at least 1.50 when the abrasive grain content is 1.0 mass %. Also, screening of the absorbance may be accomplished by assuming that if absorbance of not greater than 0.010 is exhibited when the absorbance for light with a wavelength of 450-600 nm is measured with dilution so that the abrasive grain content is greater than 0.0065 mass %, the absorbance will also be not greater than 0.010 when the abrasive grain content is 0.0065 mass %.

[Light Transmittance]

The polishing liquid of this embodiment preferably has high transparency for visible light (it is visually transparent or nearly transparent). Specifically, the abrasive grains of the polishing liquid of this embodiment preferably produce light transmittance of at least 50%/cm for light with a wavelength of 500 nm in an aqueous dispersion with a content of the abrasive grains adjusted to 1.0 mass %. This will help to reliably obtain an effect of improving the polishing rate based on the nonvolatile content as the index, as well as an effect of improved polishing rate based on absorbance as the index, and since reduction in polishing rate by addition of additives can be further inhibited, it becomes easier to obtain other properties while maintaining polishing rate. From this viewpoint, the light transmittance is more preferably at least 60%/cm, even more preferably at least 70%/cm, especially more preferably at least 80%/cm and extremely preferably at least 90%/cm. The upper limit for the light transmittance is 100%/cm.

Although the reason for which reduction in polishing rate can be inhibited by adjusting the light transmittance of the abrasive grains is not thoroughly understood, the present inventors conjecture as follows. The action exhibited as abrasive grains by the tetravalent metal element hydroxide particles, such as cerium hydroxide particles, is thought to depend more on chemical action than on mechanical action.

Therefore, the number of abrasive grains is believed to contribute to the polishing rate more than the sizes of the abrasive grains.

Figure 2:
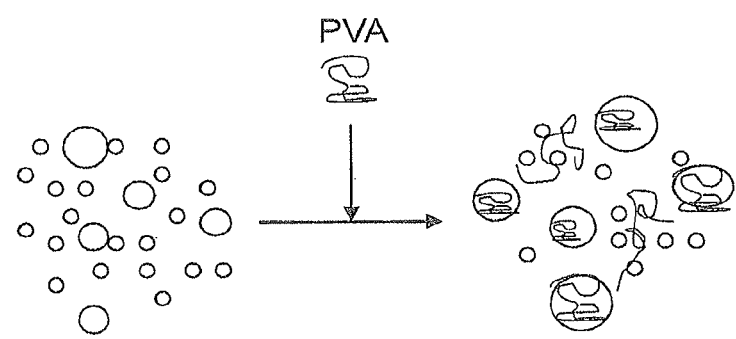
FIG. 2 is a schematic diagram showing the aggregated condition of abrasive grains when an additive has been added.

In the case of low light transmittance in an aqueous dispersion having an abrasive grain content of 1.0 mass %, the abrasive grains present in the aqueous dispersion presumably have relatively more particles with large particle sizes (hereunder referred to as "coarse particles"). When an additive (such as polyvinyl alcohol (PVA)) is added to a polishing liquid comprising such abrasive grains, other particles aggregate around the coarse particles as nuclei, as shown in FIG. 2. As a result, the number of abrasive grains acting on the surface to be polished per unit area (the effective abrasive grain number) is reduced and the specific surface area of the abrasive grains contacting with the surface to be polished is reduced, whereby presumably reduction in the polishing rate occur.

Figure 3:
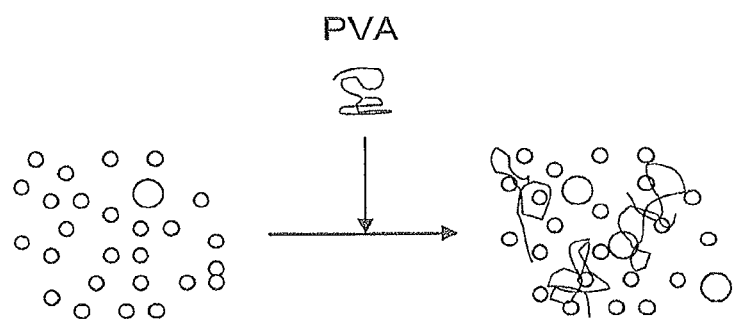
FIG. 3 is a schematic diagram showing the aggregated condition of abrasive grains when an additive has been added.

Conversely, in the case of high light transmittance in an aqueous dispersion having an abrasive grain content of 1.0 mass %, the abrasive grains present in the aqueous dispersion presumably are in the state of fewer "coarse particles". In such cases with a low abundance of coarse particles, few coarse particles are available as nuclei for aggregation, and therefore aggregation between abrasive grains is inhibited or the sizes of the aggregated particles are smaller than the aggregated particles shown in FIG. 2, even when an additive (such as polyvinyl alcohol) is added to the polishing liquid, as shown in FIG. 3. As a result, the number of abrasive grains acting on the surface to be polished per unit area (the effective abrasive grain number) is maintained and the specific surface area of the abrasive grains contacting with the surface to be polished is maintained, whereby presumably reduction in the polishing rate does not easily occur.

According to research by the present inventors, it was found that even among polishing liquids having identical particle sizes to each other as measured with a common particle size measuring apparatus, some may be visually transparent (high light transmittance) and some visually turbid (low light transmittance). This suggests that coarse particles, which produce the action described above, contribute to reduced polishing rate even in slight amounts that cannot be detected with common particle size measuring apparatuses.

It was also found that even repeated filtration to reduce the amount of coarse particles does not significantly improve the phenomenon of reduced polishing rate with addition of additives, and in some cases the aforementioned effect of improving polishing rate due to absorbance is not adequately exhibited. The present inventors found that this problem can be overcome by using abrasive grains with high light transmittance in aqueous dispersion, by modifying the method for producing the abrasive grains, for example.

The light transmittance is the transmittance for light with a wavelength of 500 nm. The light transmittance is measured with a spectrophotometer, and specifically, it is measured with an U3310 Spectrophotometer (apparatus name) by Hitachi, Ltd., for example.

As a more specific measuring method, an aqueous dispersion with a content of the abrasive grains adjusted to 1.0 mass % is prepared as a measuring sample. Approximately 4 mL of the measuring sample is placed in a 1 cm-square cell, the cell is set in the apparatus, and measurement is conducted. If the light transmittance is at least 50%/cm in an aqueous dispersion having an abrasive grain content of greater than 1.0 mass %, it is clear that the light transmittance will also be at least 50%/cm when the measuring sample is diluted to 1.0 mass %. Therefore, using an aqueous dispersion with an abrasive grain content of greater than 1.0 mass % allows screening of the light transmittance by a convenient method.

[Method for Production of Abrasive Grains]

The tetravalent metal element hydroxide is preferably produced by mixing a tetravalent metal element salt (metal salt) and an alkali solution. This will allow particles with extremely fine particle sizes to be obtained, whereby a polishing liquid with an even more excellent effect of reducing scratches can be obtained. This method is disclosed in Patent document 4, for example. The tetravalent metal element hydroxide may be obtained by mixing an aqueous solution of a tetravalent metal element salt and an alkali solution. Examples of tetravalent metal element salts include $M(SO_4)_2$, $M(NH_4)_2(NO_3)_6$ and $M(NH_4)_4(SO_4)_4$, where M is the metal.

The means for adjusting the absorbance or light transmittance may be optimization of the method for producing the tetravalent metal element hydroxide. The method of altering the absorbance for light with a wavelength of 400 nm or a wavelength of 290 nm may be, specifically, selecting the base in the alkali solution, adjusting the starting concentrations of the metal salt aqueous solution and the alkali solution, or adjusting the mixing rate of the metal salt aqueous solution and the alkali solution. The method of altering the light transmittance for light with a wavelength of 500 nm may be, specifically, adjusting the starting concentrations of the metal salt aqueous solution and the alkali solution, adjusting the mixing rate of the metal salt aqueous solution and the alkali solution, adjusting the stirring speed for mixing, or adjusting the liquid temperature during mixing.

In order to increase the absorbance for light with a wavelength of 400 nm or a wavelength of 290 nm, and to increase the light transmittance for light with a wavelength of 500 nm, the method for producing the tetravalent metal element hydroxide is preferably more "moderate". A method of controlling the absorbance and light transmittance will now be explained in greater detail.

{Alkali Solution}

The base to be used as an alkaline source in the alkali solution (such as an aqueous alkali solution) is not particularly restricted, but specific examples include organic bases such as ammonia, triethylamine, pyridine, piperidine, pyrrolidine, imidazole and chitosan and inorganic bases such as potassium hydroxide and sodium hydroxide. These bases may be used alone or in combinations of two or more.

From the viewpoint of further inhibiting rapid reaction and further increasing the absorbance for light with a wavelength of 400 nm and a wavelength of 290 nm, the alkali solution used is preferably an alkali solution exhibiting weak basicity. Of the bases mentioned above, nitrogen-containing heterocyclic organic bases are preferred, pyridine, piperidine, pyrrolidine and imidazole are more preferred, and pyridine and imidazole are even more preferred.

{Concentration}

The absorbance for light with a wavelength of 400 nm or a wavelength of 290 nm, and the light transmittance for light with a wavelength of 500 nm, can be altered by controlling the starting concentrations of the metal salt aqueous solution and the alkali solution. Specifically, the absorbance and light transmittance tend to be higher with reduced progression of the reaction between the acid and alkali per unit time, and for example, the absorbance and light transmittance tend to be higher with increased concentration of the metal salt aqueous solution, while the absorbance and light transmittance tend to be higher with reduced concentration of the alkali solution. When a nitrogen-containing heterocyclic organic base or the like exhibiting weak basicity is used as the base, the alkali solution concentration is preferably higher than when ammonia is used, from the viewpoint of productivity.

From the viewpoint of a gentler rise in pH, the metal salt concentration of the tetravalent metal element salt in the metal salt aqueous solution is preferably 0.010 mol/L or greater, more preferably 0.020 mol/L or greater and even more preferably 0.030 mol/L or greater, based on the total metal salt aqueous solution. There is no particular restriction on the upper limit for the metal salt concentration of the tetravalent metal element, but for easier manageability, it is preferably not greater than 1.000 mol/L based on the total metal salt aqueous solution.

From the viewpoint of a gentler rise in pH, the alkaline concentration of the alkali solution is preferably not greater than 15.0 mol/L, more preferably not greater than 12.0 mol/L and even more preferably not greater than 10.0 mol/L or greater, based on the total alkali solution. There is no particular restriction on the lower limit for the alkali solution, but from the viewpoint of productivity, it is preferably at least 0.001 mol/L based on the total alkali solution.

The alkaline concentration of the alkali solution is preferably adjusted as appropriate depending on the type of alkali selected. For example, for an alkali with a pKa in the range of 20 or greater, the alkaline concentration is preferably not greater than 0.1 mol/L, more preferably not greater than 0.05 mol/L and even more preferably not greater than 0.01 mol/L based on the total alkali solution, from the viewpoint of a gentler rise in pH. There is no particular restriction on the lower limit for the alkali solution, but from the viewpoint of productivity, it is preferably at least 0.001 mol/L based on the total alkali solution.

For an alkali with a pKa in the range of 12 or greater and less than 20, the alkaline concentration is preferably not greater than 1.0 mol/L, more preferably not greater than 0.5 mol/L and even more preferably not greater than 0.1 mol/L based on the total alkali solution, from the viewpoint of a gentler rise in pH. There is no particular restriction on the lower limit for the alkali solution, but from the viewpoint of productivity, it is preferably at least 0.01 mol/L based on the total alkali solution.

For an alkali with a pKa in the range of less than 12, the alkaline concentration is preferably not greater than 15.0 mol/L, more preferably not greater than 10.0 mol/L and even more preferably not greater than 5.0 mol/L based on the total alkali solution, from the viewpoint of a gentler rise in pH. There is no particular restriction on the lower limit for the alkali solution, but from the viewpoint of productivity, it is preferably at least 0.1 mol/L based on the total alkali solution.

Specific examples of alkalis with pKa values in these ranges include 1,8-diazabicyclo[5.4.0]undec-7-ene (pKa: 25) as an alkali with a pKa of 20 or greater, potassium hydroxide (pKa: 16) and sodium hydroxide (pKa: 13) as alkalis with a pKa of 12 or greater and less than 20, and ammonia (pKa: 9) and imidazole (pKa: 7) as alkalis with a pKa of less than 12. The pKa value of the alkali used is restricted by adjustment to an appropriate concentration, without being particularly limited thereto.

{Mixing Rate}

The absorbance for light with a wavelength of 400 nm or a wavelength of 290 nm, and the light transmittance for light with a wavelength of 500 nm, can be altered by controlling the mixing rate of the metal salt aqueous solution and the alkali solution. Specifically, the absorbance tends to be higher when the mixing rate is increased, while the absorbance tends to be lower when the mixing rate is decreased. Also, the light transmittance for light with a wavelength of 500 nm tends to be higher when the mixing rate is increased, while the light transmittance tends to be lower when the mixing rate is decreased.

From the viewpoint of absorbance and light transmittance, there is no particular restriction on the lower limit for the mixing rate, but it is preferably at least 0.1 ml/min from the viewpoint of shortening the mixing time to increase efficiency. The upper limit for the mixing rate is preferably not greater than 100 ml/min, from the viewpoint of minimizing rapid reaction. However, the mixing rate is preferably determined according to the starting concentrations, and specifically, the mixing rate is preferably decreased when the starting concentrations are high, for example.

{Stirring Speed}

By controlling the stirring speed for mixing of the metal salt aqueous solution and the alkali solution, it is possible to alter the light transmittance for light with a wavelength of 500 nm. Specifically, the light transmittance tends to be higher when the stirring speed is increased, while the light transmittance tends to be lower when the stirring speed is decreased.

As the stirring speed, for example, in the case of a mixing scale in which a stirring blade with a total length of 5 cm is used for stirring of a 2 L solution, the rotational speed of the stirring blade is preferably 50-1000 rpm. The upper limit for the rotational speed is preferably not greater than 1000 rpm, more preferably not greater than 800 rpm and even more preferably not greater than 500 rpm, from the viewpoint of preventing excessive increase in the liquid level. In the case of modifying (for example, enlarging) the mixing scale, the optimal stirring speed will be changed, but so long as it is within the range of about 50-1000 rpm, it is possible to obtain a polishing liquid with satisfactory light transmittance.

{Liquid Temperature (Synthesis Temperature)}

By controlling the liquid temperature for mixing of the metal salt aqueous solution and the alkali solution, it is possible to alter the light transmittance for light with a wavelength of 500 nm. Specifically, the light transmittance tends to be higher when the liquid temperature is reduced, while the light transmittance tends to be lower when the liquid temperature is increased.

The liquid temperature is preferably within the range of 0-60° C., as the temperature in the reaction system read upon placing a thermometer in the reaction system. The upper limit for the liquid temperature is preferably not higher than 60° C., more preferably not higher than 50° C., even more preferably not higher than 40° C., especially preferably not higher than 30° C. and especially preferably not higher than 25° C., from the viewpoint of preventing rapid reaction. From the viewpoint of facilitating progression of the reaction, the lower limit for the liquid temperature is preferably 0° C. or higher, more preferably 5° C. or higher, even more preferably 10° C. or higher, especially more preferably 15° C. or higher and extremely preferably 20° C. or higher.

The tetravalent metal element salt in the metal salt aqueous solution and the base of the alkali solution are preferably reacted at a fixed synthesis temperature T (for example, in a temperature range of synthesis temperature T±3° C.). The method of adjusting the synthesis temperature is not particularly restricted, and for example, it may be a method in which a container holding either the metal salt aqueous solution or the alkali solution is placed in a water tank filled with water, and the metal salt aqueous solution and alkali solution are mixed while adjusting the water temperature of the water tank using a Coolnics Circulator (product name: Cooling Thermopump CTP101 by Eyela) as the external circulation apparatus.

The tetravalent metal element hydroxide prepared as described above may include impurities, but the impurities can be removed, for example, by a method of repeating solid-liquid separation by centrifugal separation or the like. This can adjust the absorbance for light with a wavelength of 450-600 nm.

(Additives)

The polishing liquid of this embodiment is suitable for use in polishing of substrates with inorganic insulating films because it allows an especially superior polishing rate to be obtained for inorganic insulating films (for example, silicon oxide films), but appropriate selection of additives will allow high levels to be achieved for both the polishing rate and the polishing properties other than polishing rate.

An additive used may be a known additive without any particular restrictions, such as a dispersing agent that increases the dispersibility of the abrasive grains, a polishing rate improver that improves the polishing rate, a flattening agent (a flattening agent that reduces irregularities on the polished surface after polishing, or a global flattening agent that improves the global flatness of the substrate after polishing), or a selection ratio improver that improves the polishing selective ratio of the inorganic insulating film with respect to stopper films such as silicon nitride films or polysilicon films.

Examples of dispersing agents include vinyl alcohol polymers and their derivatives, betaine, lauryl betaine, lauryldimethylamine oxide, and the like. Examples of polishing rate improvers include β-alanine betaine, stearyl betaine, and the like. Examples of flattening agents that reduce irregularities on polished surfaces include ammonium lauryl sulfate, triethanolamine polyoxyethylene alkyl ether sulfate, and the like. Examples of global flattening agents include polyvinylpyrrolidone, polyacrolein, and the like. Examples of selection ratio improvers include polyethyleneimine, polyallylamine, chitosan, and the like. These may be used alone or in combinations of two or more.

The polishing liquid of this embodiment preferably comprises a vinyl alcohol polymer or a derivative thereof as an additive. However, vinyl alcohol, which is a monomer of polyvinyl alcohol, generally tends not to exist alone as stable compounds. Therefore, polyvinyl alcohol is usually obtained by polymerization of a vinyl carboxylate monomer such as vinyl acetate monomer to obtain poly(vinyl carboxylate), followed by saponification (hydrolysis). Thus, a vinyl alcohol polymer obtained using vinyl acetate monomer as the starting material, for example, has —OCOCH$_3$ and hydrolyzed —OH groups as functional groups in the molecule, and the proportion of —OH groups is defined as the saponification degree. That is, a vinyl alcohol polymer whose saponification degree is not 100% has a structure which is essentially a copolymer of vinyl acetate and vinyl alcohol. It may also be one in which a vinyl carboxylate monomer such as vinyl acetate monomer and another vinyl group-containing monomer (for example, ethylene, propylene, styrene or vinyl chloride) are copolymerized, and all or some of the portions derived from the vinyl carboxylate monomer are saponified. In the invention, all of these are collectively referred to as "vinyl alcohol polymers", and a "vinyl alcohol polymer" is ideally a polymer having the following structural formula.

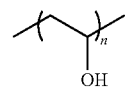

[Chemical Formula 1]

(wherein n represents a positive integer)

A "derivative" of a vinyl alcohol polymer is defined as a term including a derivative of a homopolymer of vinyl alcohol (that is, a polymer with a saponification degree of 100%), and derivatives of copolymers of vinyl alcohol monomer and other vinyl group-containing monomers (for example, ethylene, propylene, styrene, vinyl chloride or the like).

Examples of the aforementioned derivatives include polymers having a portion of the hydroxyl groups substituted with amino, carboxyl, ester groups or the like, and polymers having a portion of the hydroxyl groups modified. Examples of such derivatives include reactive polyvinyl alcohols (for example, GOHSEFIMER (registered trademark) Z by Nippon Synthetic Chemical Industry Co., Ltd.), cationized polyvinyl alcohols (for example, GOHSEFIMER (registered trademark) K by Nippon Synthetic Chemical Industry Co., Ltd.), anionized polyvinyl alcohols (for example, GOHSERAN (registered trademark) L and GOHSENOL (registered trademark) T by Nippon Synthetic Chemical Industry Co., Ltd.), and hydrophilic group-modified polyvinyl alcohols (for example, ECOMATI by Nippon Synthetic Chemical Industry Co., Ltd.).

As mentioned above, vinyl alcohol polymers and their derivatives function as abrasive grain dispersing agents, and have effects of improving polishing liquid stability. It is believed that interaction between the hydroxyl group of the vinyl alcohol polymer or its derivative and tetravalent metal element hydroxide particles can inhibit aggregation of the abrasive grains and minimize changes in particle size of the abrasive grains in the polishing liquid, thereby improving stability. Also, by using the vinyl alcohol polymer or its derivative in combination with tetravalent metal element hydroxide particles, it is possible to increase the polishing selective ratio for inorganic insulating films (for example, silicon oxide films) with respect to stopper films (for example, silicon nitride films and polysilicon films) (i.e., polishing rate for inorganic insulating films/polishing rate for stopper films). In addition, a vinyl alcohol polymer and its derivative can also improve the flatness of the polished surface after polishing, and can prevent adhesion of abrasive grains on the polished surface (cleanability improver).

The saponification degree of the vinyl alcohol polymer is preferably not greater than 95 mol % from the viewpoint of further increasing the polishing selective ratio for inorganic insulating films with respect to stopper films. From the same viewpoint, the saponification degree is more preferably not greater than 90 mol %, even more preferably not greater than 88 mol %, especially preferably not greater than 85 mol %, extremely preferably not greater than 83 mol % and very preferably not greater than 80 mol %.

There are no particular restrictions on the lower limit for the saponification degree, but from the viewpoint of excellent solubility in water, it is preferably at least 50 mol %, more preferably at least 60 mol % and even more preferably at least 70 mol %. The saponification degree of the vinyl alcohol polymer can be measured according to JIS K 6726 (Polyvinyl alcohol test method).

There are no particular restrictions on the upper limit for the mean polymerization degree (weight-average molecular weight) of the vinyl alcohol polymer, but from the viewpoint of further inhibiting reduction in polishing rate for inorganic insulating films (for example, silicon oxide films), it is preferably not greater than 3000, more preferably not greater than 2000 and even more preferably not greater than 1000.

From the viewpoint of further increasing the polishing selective ratio for inorganic insulating films with respect to stopper films, the lower limit for the mean polymerization degree is preferably at least 50, more preferably at least 100 and even more preferably at least 150. The mean polymerization degree of the vinyl alcohol polymer can be measured according to JIS K 6726 (Polyvinyl alcohol test method).

In order to adjust the polishing selective ratio for inorganic insulating films with respect to stopper films, and the flatness of polished substrates, a combination of multiple polymers with different saponification degrees or mean polymerization degrees may be used as the vinyl alcohol polymer or its derivative. In such cases, preferably the saponification degree of at least one vinyl alcohol polymer and its derivative is not greater than 95 mol %, and from the viewpoint of further improving the polishing selective ratio, the average saponification degree calculated from each saponification degree and the mixing ratio is preferably not greater than 95 mol %. The preferred range for these saponification degrees is the same range specified above.

From the viewpoint of more efficiently obtaining the effects of additives, the additive content is preferably 0.01 mass % or greater, more preferably 0.1 mass % or greater and even more preferably 1.0 mass % or greater, based on the total mass of the polishing liquid. From the viewpoint of further inhibiting reduction in the polishing rate for inorganic insulating films, the additive content is preferably not greater than 10 mass %, more preferably not greater than 5.0 mass % and even more preferably not greater than 3.0 mass % based on the total mass of the polishing liquid.

(Water)

There are no particular restrictions on the water used in the polishing liquid of this embodiment, but deionized water or ultrapure water is preferred. The water content is not particularly restricted and may be the remaining portion of the polishing liquid excluding the other constituent components.

The method of dispersing the abrasive grains in water is not particularly restricted, and specifically, a dispersion method employing stirring, a homogenizer, an ultrasonic disperser or a wet ball mill may be used.

[Polishing Liquid Properties]

The pH of the polishing liquid is preferably 2.0-9.0, for a satisfactory relationship of the surface potential of the abrasive grains with respect to the surface potential of the surface to be polished, to facilitate action of the abrasive grains on the surface to be polished, and thereby obtaining a more superior polishing rate. From the viewpoint of stabilizing the pH of the polishing liquid and minimizing problems such as aggregation of the abrasive grains due to addition of a pH stabilizer, the lower limit for the pH is preferably at least 2.0, more preferably at least 4.0 and even more preferably at least 5.0. Also, from the viewpoint of excellent dispersibility of the abrasive grains and obtaining a more superior polishing rate, the upper limit for the pH is preferably not greater than 9.0, more preferably not greater than 7.5 and even more preferably not greater than 6.5.

The pH of the polishing liquid can be measured with a pH meter (for example, a Model PH81 by Yokogawa Electric Corp.). The pH is measured by placing an electrode in the polishing liquid after 2-point calibration using standard buffer (phthalate pH buffer: pH 4.01 (25° C.), neutral phosphate pH buffer: pH 6.86 (25° C.)), and then measuring the value upon stabilization after an elapse of 2 minutes or more.

Any known pH regulator may be used to adjust the pH of the polishing liquid, without any particular restrictions, and specifically, there may be used inorganic acids such as phosphoric acid, sulfuric acid or nitric acid, organic acids such as formic acid, acetic acid, propionic acid, maleic acid, phthalic acid, citric acid or succinic acid, amines such as ethylenediamine, toluidine, piperazine, histidine or aniline, and nitrogen-containing heterocyclic compounds such as pyridine, imidazole, triazole or pyrazole.

A pH stabilizer is an additive for adjustment to a prescribed pH, and it is preferably a buffer component. The buffer component is preferably a compound with a pKa in the range of ±1.5, and more preferably a compound with a pKa in the range of ±1.0, relative to the prescribed pH. Such compounds include amino acids such as glycine, arginine, lysine, asparagine, aspartic acid and glutamic acid, amines such as ethylenediamine, 2-aminopyridine, 3-aminopyridine, picolinic acid, histidine, piperazine, morpholine, piperidine, hydroxylamine and aniline, nitrogen-containing heterocyclic compounds such as pyridine, imidazole, benzimidazole, pyrazole, triazole and benzotriazole, and carboxylic acids such as formic acid, acetic acid, propionic acid, malonic acid, succinic acid, glutaric acid, adipic acid, maleic acid, fumaric acid, phthalic acid, citric acid, lactic acid and benzoic acid.

<Slurry>

The slurry of this embodiment may be used directly for polishing, or it may be used as a slurry in a "two-pack type polishing liquid", having the constituent components of the polishing liquid separated into a slurry and an additive solution. According to this embodiment, the polishing liquid and the slurry differ in the presence or absence of additives, and the polishing liquid is obtained by adding the additives to the slurry.

The slurry of this embodiment comprises at least the same abrasive grains as the polishing liquid of this embodiment, and water. For example, the abrasive grains include a tetravalent metal element hydroxide, and produce a liquid phase with a nonvolatile content of 500 ppm or greater when an aqueous dispersion with a content of the abrasive grains adjusted to 1.0 mass % has been centrifuged for 50 minutes at a centrifugal acceleration of $1.59 \times 10^5$ G. The mean secondary particle size of the abrasive grains is the same as the abrasive grains used in the polishing liquid of this embodiment. These preferred ranges and measuring methods for the nonvolatile content and mean secondary particle size are the same as for the polishing liquid of this embodiment.

In the slurry of this embodiment, the abrasive grains preferably satisfy at least one of conditions (a) and (b) above. Also, the abrasive grains preferably produce absorbance of not greater than 0.010 for light with a wavelength of 450-600 nm in an aqueous dispersion with a content of the abrasive grains adjusted to 0.0065 mass %. Also, the abrasive grains preferably produce light transmittance of 50%/cm or greater for light with a wavelength of 500 nm in an aqueous dispersion with a content of the abrasive grains adjusted to 1.0 mass %. These preferred ranges and measuring methods for the absorbance and light transmittance are the same as for the polishing liquid of this embodiment.

In the slurry of this embodiment, the abrasive grain content is not particularly restricted, but it is preferably not greater than 15 mass % based on the total mass of the slurry, from the viewpoint of helping to avoid aggregation of the abrasive grains. The abrasive grain content is preferably 0.01 mass % or greater based on the total mass of the slurry, from the viewpoint of allowing the mechanical effect of the abrasive grains to be easily obtained.

Of the constituent components of the slurry of this embodiment, the tetravalent metal element hydroxide is believed to have a major effect on the polishing properties. The tetravalent metal element hydroxide content is preferably not greater than 10 mass % based on the total mass of the slurry, from the viewpoint of helping to avoid aggregation of the abrasive grains, as well as achieving satisfactory chemical interaction with the surface to be polished and thereby allowing further improvement in the polishing rate. The tetravalent metal element hydroxide content is preferably 0.01 mass % or greater based on the total mass of the slurry, from the viewpoint of allowing the function of the tetravalent metal element hydroxide to be adequately exhibited.

The pH of the slurry of this embodiment is preferably 2.0-9.0, for a satisfactory surface potential of the abrasive grains with respect to the surface potential of the surface to be polished, to facilitate action of the abrasive grains on the surface to be polished, and thereby obtaining a more superior polishing rate. Also, from the viewpoint of stabilizing the pH of the slurry and minimizing problems such as aggregation of the abrasive grains due to addition of a pH stabilizer, the lower limit for the pH is preferably at least 2.0, more preferably at least 2.5 and even more preferably at least 3.0. Furthermore, from the viewpoint of excellent dispersibility of the abrasive grains and obtaining a more superior polishing rate, the upper limit for the pH is preferably not greater than 9.0, more preferably not greater than 7.0 and even more preferably not greater than 5.0. The pH of the slurry can be measured by the same method as for the pH of the polishing liquid of this embodiment.

<Polishing Liquid Set>

In the polishing liquid set of this embodiment, the constituent components of the polishing liquid are separately stored as a slurry and an additive solution, so that the slurry (first liquid) and additive solution (second liquid) are mixed to form the polishing liquid. The slurry used may be the slurry according to this embodiment. The additive solution used may be a solution having the additive dissolved in water. The polishing liquid set is used as a polishing liquid by mixing the slurry and additive solution at the time of polishing. By thus separately storing the constituent components of the polishing liquid into at least two liquids, it is possible to obtain a polishing liquid with excellent storage stability.

The additives used in the additive solution may be the same additives as described for the polishing liquid. The content of additives in the additive solution is preferably 0.01-20 mass % and more preferably 0.02-20 mass %, based on the total mass of the additive solution, from the viewpoint of inhibiting excessive reduction in the polishing rate when the additive solution and slurry are mixed to form the polishing liquid.

There are no particular restrictions on the water for the additive solution, but deionized water or ultrapure water is preferred. The water content is not particularly restricted and may be the content of the remainder excluding the other constituent components.

<Substrate Polishing Method and Substrate>

A substrate polishing method using the aforementioned polishing liquid, slurry or polishing liquid set, and a substrate obtained by the method, will now be described. When the polishing liquid or slurry is to be used, it will be a polishing method using a one-pack type polishing liquid, and when the polishing liquid set is to be used, it will be a polishing method using a two-pack type polishing liquid or a three-pack or greater type polishing liquid.

In the substrate polishing method of this embodiment, polishing is performed on a substrate having a film to be polished on its surface. In the substrate polishing method of this embodiment, the film to be polished may be polished using a stopper film formed under the film to be polished. The substrate polishing method of this embodiment comprises at least a substrate positioning step and a polishing step. In the substrate positioning step, a film to be polished, of a substrate which has the film to be polished on its surface, is placed so as to face an abrasive pad.

The film to be polished is preferably an inorganic insulating film, such as a silicon oxide film. The silicon oxide film can be obtained by low-pressure CVD method, plasma CVD, or the like. The silicon oxide film may be doped with an element such as phosphorus or boron. The inorganic insulating film may be a Low-k film or the like. The surface of the film to be polished (surface to be polished) preferably has irregularities. In the substrate polishing method of this embodiment, the convexities of the irregularities of the film to be polished are preferentially polished, to obtain a substrate with a flattened surface.

In the polishing step, when a one-pack type polishing liquid is to be used, in the state that the film to be polished of the substrate is pressed against the abrasive pad of the polishing platen, at least a portion of the film to be polished is polished by relatively moving the substrate and the polishing platen while supplying the polishing liquid or slurry between the abrasive pad and the film to be polished. Here, the polishing liquid and slurry may be supplied onto the abrasive pad directly as a polishing liquid with the prescribed water content.

From the viewpoint of minimizing costs for preservation, transport and storage, the polishing liquid and slurry of this embodiment can be stored as a storage solution for a polishing liquid or a storage solution for a slurry to be used, for example, in a two-fold or greater dilution with a liquid medium such as water at the time of use. The storage solution may be diluted with the liquid medium immediately before polishing, or the storage solution and liquid medium may be supplied onto the abrasive pad for dilution on the abrasive pad.

Since a greater dilution factor of the storage solution results in a greater effect of minimizing cost for preservation, transport and storage, it is preferably two-fold or greater and more preferably 3-fold or greater. There are no particular restrictions on the upper limit, but a greater dilution factor requires a greater amount of components in the storage solution (a higher concentration), which tend to lower the stability during storage, and therefore it is preferably not greater than 500-fold, more preferably not greater than 200-fold, even more preferably not greater than 100-fold and especially preferably not greater than 50-fold. The same is applied for a polishing liquid with the constituent components divided into 3 or more liquids.

When a two-pack type polishing liquid is to be used, the method may include a polishing liquid preparation step in which the slurry and additive solution are mixed before the polishing step to obtain a polishing liquid. In this case, in the polishing step, the film to be polished is polished using the polishing liquid obtained from the polishing liquid preparation step. In the polishing liquid preparation step of this polishing method, the slurry and additive solution are conveyed through separate tubings, and the tubings are merged just before the supply tubing outlet to obtain the polishing liquid. Alternatively, the polishing liquid may be supplied onto the abrasive pad directly as a polishing liquid with the prescribed water content. The same is applied for a polishing liquid with the constituent components divided into 3 or more liquids.

In the polishing step, when a two-pack type of polishing liquid is to be used, at least a portion of the film to be polished may be polished using the polishing liquid obtained by mixing the slurry and additive solution while respectively supplying the slurry and additive solution. In this polishing method, the slurry and additive solution may be supplied onto the abrasive pad through separate liquid conveyance systems. The slurry may be diluted on the abrasive pad after being supplied onto the abrasive pad as the aforementioned slurry storage solution, and the additive solution may be diluted on the abrasive pad after being supplied onto the abrasive pad as a storage solution with a low water content. The same is applied for a polishing liquid with the constituent components divided into 3 or more liquids.

The polishing apparatus to be used in the polishing method of this embodiment may be, for example, a common polishing apparatus comprising a holder to hold the substrate with the film to be polished, and a polishing platen that mounts a motor having a variable rotational speed and allows attachment of an abrasive pad. Examples of such polishing apparatuses include a polishing apparatus by Ebara Corp. (Model EPO-111), and polishing apparatuses by Applied Materials (trade names: Mirra3400 and Reflection Polishing Machine).

There are no particular restrictions on the abrasive pad, and a common nonwoven fabric, foamed polyurethane, porous fluorine resin or the like may be used. The abrasive pad is preferably furrowed to allow accumulation of the polishing liquid.

The polishing conditions are not particularly restricted, but from the viewpoint of minimizing fly off of the semiconductor substrate, the rotational speed of the polishing platen is preferably a low speed of not greater than 200 rpm. The pressure (machining load) on the semiconductor substrate is preferably not greater than 100 kPa, from the viewpoint of further minimizing formation of scratches after polishing. The polishing liquid is preferably continuously supplied to the surface of the abrasive pad with a pump or the like during polishing. The amount supplied is not particularly restricted, but the surface of the abrasive pad is preferably covered by the polishing liquid at all times. Preferably, the polished semiconductor substrate is thoroughly rinsed in running water, and is then dried after removing off the water droplets adhering to the semiconductor substrate using a spin dryer or the like.

According to this embodiment, there is provided the use of the aforementioned polishing liquid, slurry and polishing liquid set for polishing of a film to be polished (for example, a silicon oxide film). Also according to this embodiment, there is provided the use of the aforementioned polishing liquid, slurry and polishing liquid set for polishing of a film to be polished (for example, a silicon oxide film) using a stopper film (for example, a silicon nitride film or polysilicon film).

EXAMPLES

The present invention will now be described in greater detail by examples, with the understanding that the invention is not limited to these examples.

Examples 1 to 6, Comparative Examples 1 and 2

(Preparation of Tetravalent Metal Element Hydroxides)

Tetravalent metal element hydroxides were prepared by the following procedure. The values indicated as A to G throughout the explanation below are the values shown in Table 1.

After placing A [g] of water into a container, B [g] of cerium ammonium nitrate aqueous solution (general formula: $Ce(NH_4)_2(NO_3)_6$, formula weight: 548.2 g/mol) at a concentration of 50 mass % was added and mixed therewith, and the liquid temperature was adjusted to C [° C.] to obtain a metal salt aqueous solution. The metal salt concentration of the metal salt aqueous solution was as shown in Table 1.

Next, the alkali shown in Table 1 was dissolved in water to prepare E [g] of an aqueous solution at a concentration of D [mol/L], and the liquid temperature was adjusted to a temperature of C [° C.] to obtain an alkali solution.

The container holding the metal salt aqueous solution was placed in a water tank filled with water and the water temperature of the water tank was adjusted to the temperature indicated by C [° C.] in Table 1 using an external-circulating Coolnics Circulator (product name: Cooling Thermopump CTP101 by Eyela). The alkali solution was added into the container at a mixing rate of G [mL/min] while keeping the water temperature at C [° C.] and stirring the metal salt aqueous solution at the stirring speed indicated by F [rpm] in Table 1, to obtain slurry precursor 1 comprising abrasive grains of tetravalent cerium hydroxide. The pH of slurry precursor 1 was as indicated by "final pH" in Table 1. In Example 4, a 4-blade pitched paddle with a total blade length of 17 cm was used for stirring of the metal salt aqueous solution, while in the other examples and the comparative examples, an ordinary stirring blade with a total blade length of 5 cm was used for stirring of the metal salt aqueous solution.

Slurry precursor 1 was centrifuged and subjected to solid-liquid separation by decantation to remove the liquid. The procedure of adding a suitable amount of water to the obtained resultant solid, thoroughly stirring and conducting solid-liquid separation by decantation was carried out an additional 3 times.

After again adding water to the obtained resultant solid to adjust the liquid volume to 2.0 L, ultrasonic dispersion treatment was carried out for 180 minutes to obtain slurry precursor 2. A suitable amount of the obtained slurry precursor 2 was sampled, and the mass after drying (the nonvolatile component mass) was measured to calculate the content of tetravalent cerium hydroxide abrasive grains in the slurry precursor 2.

TABLE 1

| | Metal salt solution | | | Alkali solution | | | Synthesis conditions | | | |
|---|---|---|---|---|---|---|---|---|---|---|
| | 50 mass % metal | | | | | Alkali | | | | |
| | Water amount A [g] | salt solution amount B [g] | Concentration [mol/L] | Alkali type | Concentration D [mol/L] | solution amount E [g] | Mixing speed G [mL/min] | Stirring speed F [rpm] | Synthesis temp. C [° C.] | Final pH |
| Example 1 | 1840 | 76.8 | 0.037 | Ammonia | 8.8 | 29 | 10 | 200 | 25 | 5.2 |
| Example 2 | 1656 | 69.1 | 0.037 | Imidazole | 1.5 | 152 | 10 | 500 | 10 | 5.2 |
| Example 3 | 1656 | 69.1 | 0.037 | Imidazole | 1.5 | 152 | 5 | 500 | 10 | 5.2 |
| Example 4 | 165600 | 6912 | 0.037 | Imidazole | 1.5 | 15200 | 80 | 100 | 15 | 5.2 |
| Example 5 | 1656 | 69.1 | 0.037 | Imidazole | 1.5 | 152 | 2 | 500 | 10 | 5.2 |
| Example 6 | 1656 | 69.1 | 0.037 | Imidazole | 1.5 | 152 | 10 | 500 | 25 | 4.5 |
| Comp. Ex. 1 | 1840 | 76.8 | 0.037 | Ammonia | 14.7 | 17 | 25 | 200 | 25 | 5.2 |
| Comp. Ex. 2 | 2500 | 40.0 | 0.014 | Potassium hydroxide | 1.8 | 70 | 10 | 500 | 25 | 5.2 |

(Measurement of Nonvolatile Content of Supernatant Liquid after Centrifugal Separation)

A suitable amount of slurry precursor 2 was sampled and diluted with water to an abrasive grain content of 1.0 mass % to obtain a measuring sample (aqueous dispersion). The sample was filled into the centrifuge tube of an ultracentrifuge by Hitachi Koki Co., Ltd. (apparatus name: 70P-72), and the ultracentrifuge was used for 50 minutes of centrifugation at a rotational speed of 50000 (rpm). In the ultracentrifuge, the tube angle was 26°, the minimum radius $R_{min}$ was 3.53 cm, the maximum radius $R_{max}$ was 7.83 cm and the average radius $R_{av}$ was 5.68 cm. The centrifugal acceleration calculated from average radius $R_{av}$ was 158756 G=1.59×10$^5$ G.

After sampling 5.0 g of the supernatant liquid from the tube after centrifugal separation, the dried mass was measured to calculate the nonvolatile content of the supernatant liquid (the content of tetravalent cerium hydroxide abrasive grains). The results are shown in Table 2.

(Measurement of Absorbance and Light Transmittance)

A suitable amount of slurry precursor 2 was sampled and diluted with water to an abrasive grain content of 0.0065 mass % (65 ppm) to obtain a measuring sample (aqueous dispersion). Approximately 4 mL of the measuring sample was placed in a 1 cm-square cell, and the cell was set in a spectrophotometer (apparatus name: U3310) by Hitachi, Ltd. Spectrophotometry was performed in a wavelength range of 200-600 nm to determine the absorbance at a wavelength of 290 nm and the absorbance at a wavelength of 450-600 nm. The results are shown in Table 2.

A suitable amount of slurry precursor 2 was also sampled and diluted with water to an abrasive grain content of 1.0 mass % to obtain a measuring sample (aqueous dispersion). Approximately 4 mL of the measuring sample was placed in a 1 cm-square cell, and the cell was set in a spectrophotometer (apparatus name: U3310) by Hitachi, Ltd. Spectrophotometry was performed in a wavelength range of 200-600 nm to measure the absorbance for light with a wavelength of 400 nm and the light transmittance for light with a wavelength of 500 nm. The results are shown in Table 2.

(Measurement of Mean Secondary Particle Size)

A suitable amount of slurry precursor 2 was sampled and diluted with water to an abrasive grain content of 0.2 mass % to obtain a measuring sample. Approximately 4 mL of the measuring sample was placed in a 1 cm-square cell, and the cell was set in a Zetasizer 3000HS, an apparatus name by Malvern Instruments Ltd. Measurement was conducted at 25° C. with a dispersing medium refractive index of 1.33 and a viscosity of 0.887 mPa·s, and the value represented by Z-average Size was read as the mean secondary particle size. The results are shown in Table 2.

TABLE 2

| | Supernatant nonvolatile content [ppm] | Absorbance [290 nm] Abrasive grain content: 65 ppm | Absorbance [450-600 nm] Abrasive grain content: 65 ppm | Absorbance [400 nm] Abrasive grain content: 1.0 mass % | Light transmittance [500 nm] [%/cm] Abrasive grain content: 1.0 mass % | Mean secondary particle size [nm] |
|---|---|---|---|---|---|---|
| Example 1 | 760 | 1.112 | <0.010 | 1.57 | 62 | 74 |
| Example 2 | 1280 | 1.140 | <0.010 | 1.83 | >99 | 21 |
| Example 3 | 1830 | 1.238 | <0.010 | 2.28 | >99 | 24 |
| Example 4 | 3020 | 1.312 | <0.010 | 3.02 | >99 | 18 |
| Example 5 | 2380 | 1.232 | <0.010 | 2.68 | >99 | 20 |
| Example 6 | 3070 | 1.230 | <0.010 | 2.04 | >99 | 22 |
| Comp. Ex. 1 | 280 | 1.256 | <0.010 | 2.70 | 41 | 95 |
| Comp. Ex. 2 | 370 | 1.239 | <0.010 | 2.22 | 46 | 91 |

(Preparation of Polishing Liquids)

Water was added to slurry precursor 2 for adjustment to an abrasive grain content of 1 mass % to obtain a storage solution for a slurry. The results of observing the outer appearance of each storage solution for a slurry are shown in Table 3.

Purified water was added to 60 g of the storage solution for a slurry to obtain a slurry. Also, a 5 mass % polyvinyl alcohol aqueous solution was prepared as an additive solution. After adding 60 g of the additive solution to the slurry, the mixture was mixed and stirred to obtain a polishing liquid with an abrasive grain content of 0.2 mass %. The amount of purified water added was calculated to be for a final abrasive grain content of 0.2 mass %. The saponification degree of polyvinyl alcohol in the polyvinyl alcohol aqueous solution was 80 mol %, and the mean polymerization degree was 300. The polyvinyl alcohol content in the polishing liquid was 1.0 mass %. The pH (25° C.) values of the slurry and polishing liquid, as measured using a Model PH81 by Yokogawa Electric Corp., were 3.6 and 6.0.

(Polishing of Insulating Film)

A φ200 mm silicon wafer, with a silicon oxide insulating film formed thereon, was set in the holder of a polishing apparatus, mounting an adsorption pad for substrate attachment. The holder was placed on a porous urethane resin pad-attached platen, with the insulating film facing the pad. The substrate was pressed onto the pad at a polishing load of 20 kPa while supplying the obtained polishing liquid onto the pad at a feed rate of 200 cc/min. Polishing was performed for 1 minute of rotation of the platen at 78 rpm and the holder at 98 rpm. The polished wafer was thoroughly washed with purified water and dried. A light-interference film thickness meter was used to measure the change in film thickness before and after polishing, and the polishing rate was calculated. The results are shown in Table 3.

Evaluation of the absorbance, light transmittance and polishing rate were all conducted within 24 hours after preparing slurry precursor 2.

Figure 4:
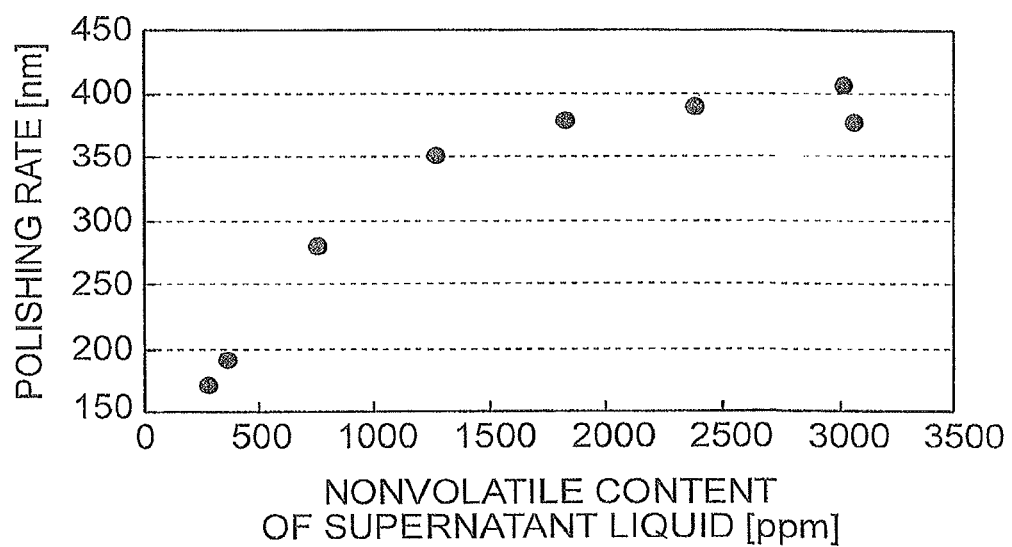
FIG. 4 is a figure showing the relationship between nonvolatile content of supernatant liquid and polishing rate.
Figure 5:
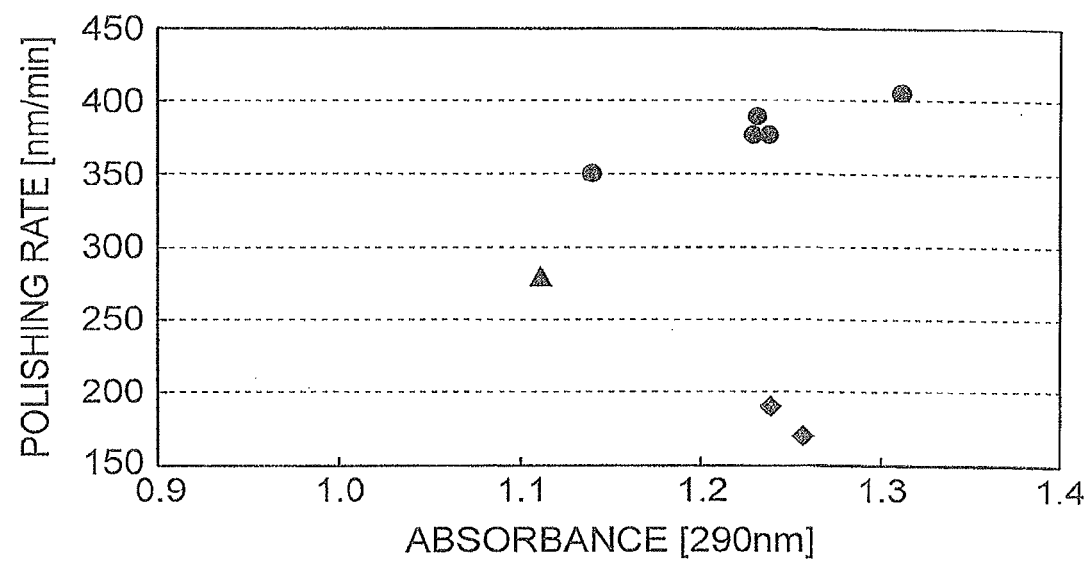
FIG. 5 is a figure showing the relationship between absorbance for light with a wavelength of 290 nm and polishing rate.
Figure 7:
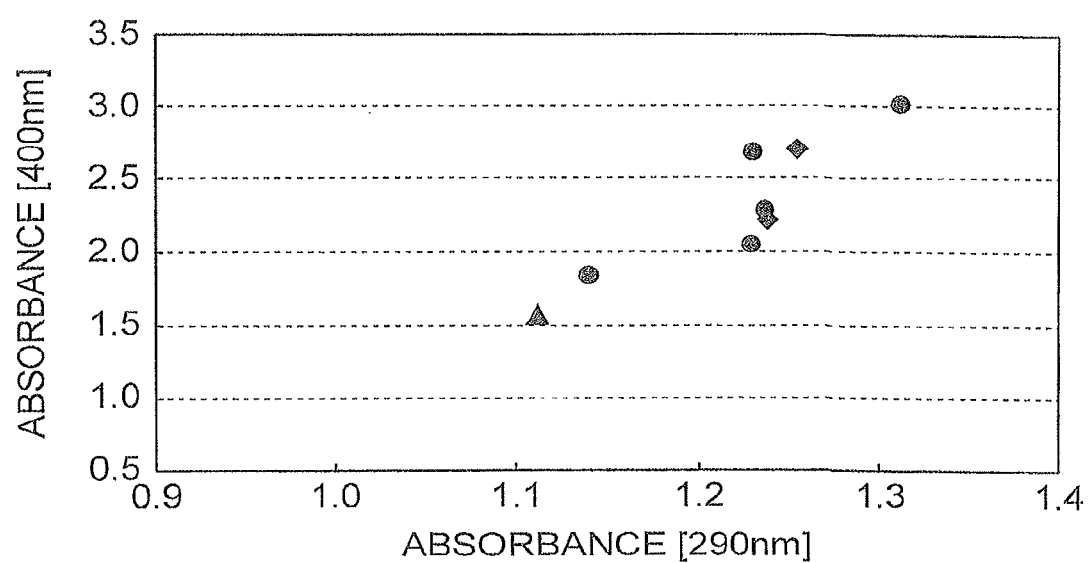
FIG. 7 is a figure showing the relationship between absorbance for light with a wavelength of 290 nm and absorbance for light with a wavelength of 400 nm.

FIG. 4 shows the relationship between nonvolatile content of the supernatant liquid [ppm] and polishing rate, FIG. 5 shows the relationship between absorbance for light with a wavelength of 290 nm and polishing rate, and FIG. 6 shows the relationship between absorbance for light with a wavelength of 400 nm and polishing rate. Also, the relationship between absorbance for light with a wavelength of 290 nm and absorbance for light with a wavelength of 400 nm is shown in FIG. 7. In FIGS. 5 to 7, a case with a light transmittance of 90%/cm or greater is indicated by a circle, a case with a light transmittance of at least 50%/cm and less than 90%/cm is indicated by a triangle, and a case with a light transmittance of less than 50%/cm is indicated by a diamond.

As clearly seen in FIG. 4, a higher nonvolatile content of the supernatant liquid is associated with improved polishing rate. Also, as clearly seen in FIGS. 5 to 6, for a polishing liquid with a high nonvolatile content of the supernatant liquid, higher absorbance for light with a wavelength of 290 nm or higher absorbance for light with a wavelength of 400 nm is associated with improved polishing rate. Also, FIG. 7 shows a good correlation between absorbance for light with a wavelength of 290 nm and absorbance for light with a wavelength of 400 nm.

TABLE 3

|  | Outer appearance of storage solution for slurry | Polishing rate (nm/min) |
| --- | --- | --- |
| Example 1 | Slightly turbid, faint yellow | 280 |
| Example 2 | Transparent, faint yellow | 350 |
| Example 3 | Transparent, faint yellow | 377 |
| Example 4 | Transparent, faint yellow | 405 |
| Example 5 | Transparent, faint yellow | 389 |
| Example 6 | Transparent, faint yellow | 376 |
| Comp. Ex. 1 | Turbid, white | 170 |
| Comp. Ex. 2 | Turbid, white | 190 |

Next, using a polishing liquid obtained using the slurry of Example 2 and a polishing liquid obtained using the slurry of Comparative Example 1, the relationship between polyvinyl alcohol (PVA) content of the polishing liquid and polishing rate was examined. Specifically, the polishing rates for silicon oxide films were examined in the same manner as Example 1, with polyvinyl alcohol contents of 3.0 mass %, 2.0 mass %, 1.0 mass %, 0.5 mass % and 0.1 mass % in the polishing liquid. The results are shown in Table 4.

TABLE 4

| PVA content (mass %) | | 3.0 | 2.0 | 1.0 | 0.5 | 0.1 |
| --- | --- | --- | --- | --- | --- | --- |
| Polishing rate (nm/min) | Comp. Ex. 1 | 90 | 135 | 170 | 225 | 232 |
|  | Example 2 | 253 | 312 | 350 | 375 | 384 |

As is clear by the results in Table 4, the polishing rate in Example 2, which employed abrasive grains that produce a liquid phase with a nonvolatile content of 500 ppm or greater, was higher than in Comparative Example 1 with addition of additives in the same amount, and therefore a wide margin exists for further addition of additives, in addition to polyvinyl alcohol. It is thought that the polishing rate was improved by the increased proportion of fine particles accompanying the higher nonvolatile content, and thus by the increased surface area of abrasive grains contacting with the surface to be polished. This indicates that in Example 2 it is possible to impart further properties by adding more additives, compared to Comparative Example 1.

REFERENCE SIGNS LIST

1: Angle rotor, A1: rotation axis, A2: tube angle, $R_{min}$: minimum radius, $R_{max}$: maximum radius, $R_{av}$: average radius.

The invention claimed is:

1. A slurry comprising abrasive grains and water, the abrasive grains including a hydroxide of tetravalent cerium, and the abrasive grains including a property of producing a liquid phase with a nonvolatile content of 500 ppm or greater when an aqueous dispersion with a content of the abrasive grains adjusted to 1.0 mass % has been centrifuged for 50 minutes at a centrifugal acceleration of $1.59 \times 10^5$ G.

2. The slurry according to claim 1, wherein the abrasive grains further include a property of producing light transmittance of 50%/cm or greater for light with a wavelength of 500 nm in an aqueous dispersion with a content of the abrasive grains adjusted to 1.0 mass %.

3. The slurry according to claim 1, wherein the hydroxide of tetravalent cerium is obtained by mixing a tetravalent cerium salt and an alkali solution.

4. A polishing liquid set comprising constituent components of a polishing liquid separately stored as a first liquid and a second liquid, so that the first liquid and the second liquid are mixed to form the polishing liquid, wherein the first liquid is the slurry according to claim 1, and the second liquid comprises an additive and water.

5. The polishing liquid set according to claim 4, wherein the additive is at least one selected from the group consisting of vinyl alcohol polymers and derivatives of the vinyl alcohol polymers.

6. The polishing liquid set according to claim 4, wherein a content of the additive is 0.01 mass % or greater based on a total mass of the polishing liquid.

7. A polishing liquid comprising abrasive grains, an additive and water, the abrasive grains including a hydroxide of tetravalent cerium, and the abrasive grains including a property of producing a liquid phase with a nonvolatile content of 500 ppm or greater when an aqueous dispersion with a content of the abrasive grains adjusted to 1.0 mass % has been centrifuged for 50 minutes at a centrifugal acceleration of $1.59 \times 10^5$ G.

8. The polishing liquid according to claim 7, wherein the abrasive grains further include a property of producing light transmittance of 50%/cm or greater for light with a wavelength of 500 nm in an aqueous dispersion with a content of the abrasive grains adjusted to 1.0 mass %.

9. The polishing liquid according to claim 7, wherein the hydroxide of tetravalent cerium is obtained by mixing a tetravalent cerium salt and an alkali solution.

10. The polishing liquid according to claim 7, wherein the additive is at least one selected from the group consisting of vinyl alcohol polymers and derivatives of the vinyl alcohol polymers.

11. The polishing liquid according to claim 7, wherein a content of the additive is 0.01 mass % or greater based on a total mass of the polishing liquid.

12. A substrate polishing method comprising:
a step of placing a film to be polished, of a substrate which has the film to be polished on its surface, so as to face an abrasive pad, and
a step of polishing at least a portion of the film to be polished while supplying the slurry according to claim 1 between the abrasive pad and the film to be polished.

13. A substrate polishing method comprising:
a step of placing a film to be polished, of a substrate which has the film to be polished on its surface, so as to face an abrasive pad,
a step of mixing the first liquid and the second liquid of the polishing liquid set according to claim 4 to obtain the polishing liquid, and
a step of polishing at least a portion of the film to be polished while supplying the polishing liquid between the abrasive pad and the film to be polished.

14. A substrate polishing method comprising:
a step of placing a film to be polished, of a substrate which has the film to be polished on its surface, so as to face an abrasive pad, and
a step of polishing at least a portion of the film to be polished while respectively supplying both the first liquid and the second liquid of the polishing liquid set according to claim 4 between the abrasive pad and the film to be polished.

15. A substrate polishing method comprising:
a step of placing a film to be polished, of a substrate which has the film to be polished on its surface, so as to face an abrasive pad, and
a step of polishing at least a portion of the film to be polished while supplying the polishing liquid according to claim 7 between the abrasive pad and the film to be polished.

16. The polishing method according to claim 12, wherein the film to be polished includes silicon oxide.

17. The polishing method according to claim 13, wherein the film to be polished includes silicon oxide.

18. The polishing method according to claim 14, wherein the film to be polished includes silicon oxide.

19. The polishing method according to claim 15, wherein the film to be polished includes silicon oxide.

20. The polishing method according to claim 12, wherein a surface of the film to be polished has irregularities.

21. The polishing method according to claim 13, wherein a surface of the film to be polished has irregularities.

22. The polishing method according to claim 14, wherein a surface of the film to be polished has irregularities.

23. The polishing method according to claim 15, wherein a surface of the film to be polished has irregularities.

24. The slurry according to claim 1, wherein a mean secondary particle size of the abrasive grains is 2-80 nm, and pH of the slurry is 2.0 to 9.0.

25. The polishing liquid according to claim 7, wherein a mean secondary particle size of the abrasive grains is 2-80 nm, and pH of the polishing liquid is 2.0 to 9.0.

\* \* \* \* \*